(12) United States Patent
Yoshioka

(10) Patent No.: US 12,412,698 B2
(45) Date of Patent: Sep. 9, 2025

(54) PASSIVE COMPONENT, THREE-DIMENSIONAL DEVICE, AND METHOD FOR MANUFACTURING PASSIVE COMPONENT

(71) Applicant: Murata Manufacturing Co., Ltd., Kyoto-fu (JP)

(72) Inventor: Yoshimasa Yoshioka, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 231 days.

(21) Appl. No.: 18/321,401

(22) Filed: May 22, 2023

(65) Prior Publication Data

US 2023/0395312 A1    Dec. 7, 2023

(30) Foreign Application Priority Data

Jun. 2, 2022  (JP) ................. 2022-090324

(51) Int. Cl.

| | | |
|---|---|---|
| H01F 27/32 | (2006.01) | |
| H01F 27/28 | (2006.01) | |
| H01F 41/04 | (2006.01) | |
| H01L 25/16 | (2023.01) | |
| H01L 25/18 | (2023.01) | |
| H10D 86/85 | (2025.01) | |

(52) U.S. Cl.
CPC ....... *H01F 27/324* (2013.01); *H01F 27/2804* (2013.01); *H01F 41/043* (2013.01); *H01L 25/16* (2013.01); *H01L 25/18* (2013.01); *H10D 86/85* (2025.01)

(58) Field of Classification Search
CPC .............................. H01F 27/324; H10D 86/85
See application file for complete search history.

(56) References Cited

U.S. PATENT DOCUMENTS

| | | | |
|---|---|---|---|
| 9,460,996 B1* | 10/2016 | Zang ............... | H01L 23/5227 |
| 2008/0023219 A1* | 1/2008 | Yoshizawa ........ | H10D 1/20 |
| | | | 174/260 |
| 2020/0294908 A1* | 9/2020 | Haba ................ | H01L 23/5223 |
| 2021/0305231 A1* | 9/2021 | Oba ................. | H10D 1/20 |

FOREIGN PATENT DOCUMENTS

| | | |
|---|---|---|
| JP | H04-284612 A | 10/1992 |
| JP | H11-243033 A | 9/1999 |
| JP | 5448393 B2 | 3/2014 |
| JP | 2020-503692 A | 1/2020 |

* cited by examiner

*Primary Examiner* — Scott Bauer
(74) *Attorney, Agent, or Firm* — Studebaker Brackett PLLC

(57) ABSTRACT

A passive component includes a body portion having a first main surface and a passive element at least a part of which is provided inside the body portion. The first main surface at least partially includes a flat surface made of an inorganic substance and having a surface roughness of equal to or less than 1/1000 of a thickness of the body portion in a direction orthogonal to the first main surface or equal to or less than 10 nm.

20 Claims, 19 Drawing Sheets

US 12,412,698 B2

PASSIVE COMPONENT, THREE-DIMENSIONAL DEVICE, AND METHOD FOR MANUFACTURING PASSIVE COMPONENT

CROSS-REFERENCE TO RELATED APPLICATION

This application claims benefit of priority to Japanese Patent Application No. 2022-090324, filed Jun. 2, 2022, the entire content of which is incorporated herein by reference.

BACKGROUND

Technical Field

The present disclosure relates to a passive component, a three-dimensional device and a method for manufacturing a passive component.

Background Art

In recent years, with miniaturization and high performance of stacked semiconductor packages, integration of electronic circuits has been further advanced. An existing stacked semiconductor package is disclosed in Japanese Patent No. 5448393. The stacked semiconductor package includes a first semiconductor package, a second semiconductor package stacked on the first semiconductor package, and a capacitor provided between the first semiconductor package and the second semiconductor package and connected to the first semiconductor package and the second semiconductor package. The capacitor is an example of a passive component. By stacking the first semiconductor package, the second semiconductor package, and the capacitor, a footprint (an area of a circuit or a component) is reduced in size.

SUMMARY

However, in the existing stacked semiconductor package described above, since the first semiconductor package, the second semiconductor package, and the capacitor are connected using solder balls or solder paste, the thickness of the entire stacked semiconductor package becomes thick, and then it is difficult to realize a reduction in thickness.

In view of the above, the present disclosure provides a passive component and a three-dimensional device in which reducing the thickness of an entire device such as a stacked semiconductor package can be achieved and a method for manufacturing a passive component.

A passive component according to an aspect of the present disclosure includes a body portion having a first main surface; and a passive element at least a part of which is provided inside the body portion. The first main surface at least partially includes a flat surface made of an inorganic substance and having a surface roughness of equal to or less than $1/1000$ of a thickness of the body portion in a direction orthogonal to the first main surface or equal to or less than 10 nm.

According to the aspect, since the first main surface of the body portion at least partially includes a flat surface made of an inorganic substance, when the passive component is bonded to another electronic component or the like having a flat surface, the flat surfaces can be bonded in a state of being in contact with each other. Therefore, it is possible to reduce the thickness of the entire device such as a stacked semiconductor package.

Preferably, an embodiment of a three-dimensional device includes: the passive component; and a semiconductor integrated circuit component bonded to the flat surface of the passive component.

According to the above embodiment, a thin-type three-dimensional device can be obtained.

An embodiment of a method for manufacturing a passive component includes preparing an inorganic layer made of an inorganic substance and having a first main surface and a second main surface facing each other; forming a body portion including the inorganic layer and at least a part of a passive element by providing the passive element on the second main surface side of the inorganic layer; and providing a flat surface having a surface roughness of equal to or less than $1/1000$ of a thickness of the body portion in a direction orthogonal to the first main surface or equal to or less than 10 nm by polishing the first main surface of the inorganic layer.

According to the embodiment, since the first main surface of the inorganic layer includes a flat surface, when the passive component is bonded to another electronic component or the like having a flat surface, the flat surfaces can be bonded in a state of being in contact with each other. Therefore, it is possible to reduce the thickness of the entire device such as a stacked semiconductor package.

According to a passive component, a three-dimensional device, and a method for manufacturing a passive component according to an aspect of the present disclosure, it is possible to reduce the thickness.

DETAILED DESCRIPTION

Hereinafter, a passive component, a three-dimensional device, and a method for manufacturing a passive component according to an aspect of the present disclosure will be described in detail with reference to embodiments illustrated in the accompanying drawings. Note that the accompanying drawings are partially schematic and do not reflect actual dimensions or ratios in some cases.

First Embodiment

1. Schematic Configuration of Passive Component 1

Figure 1:
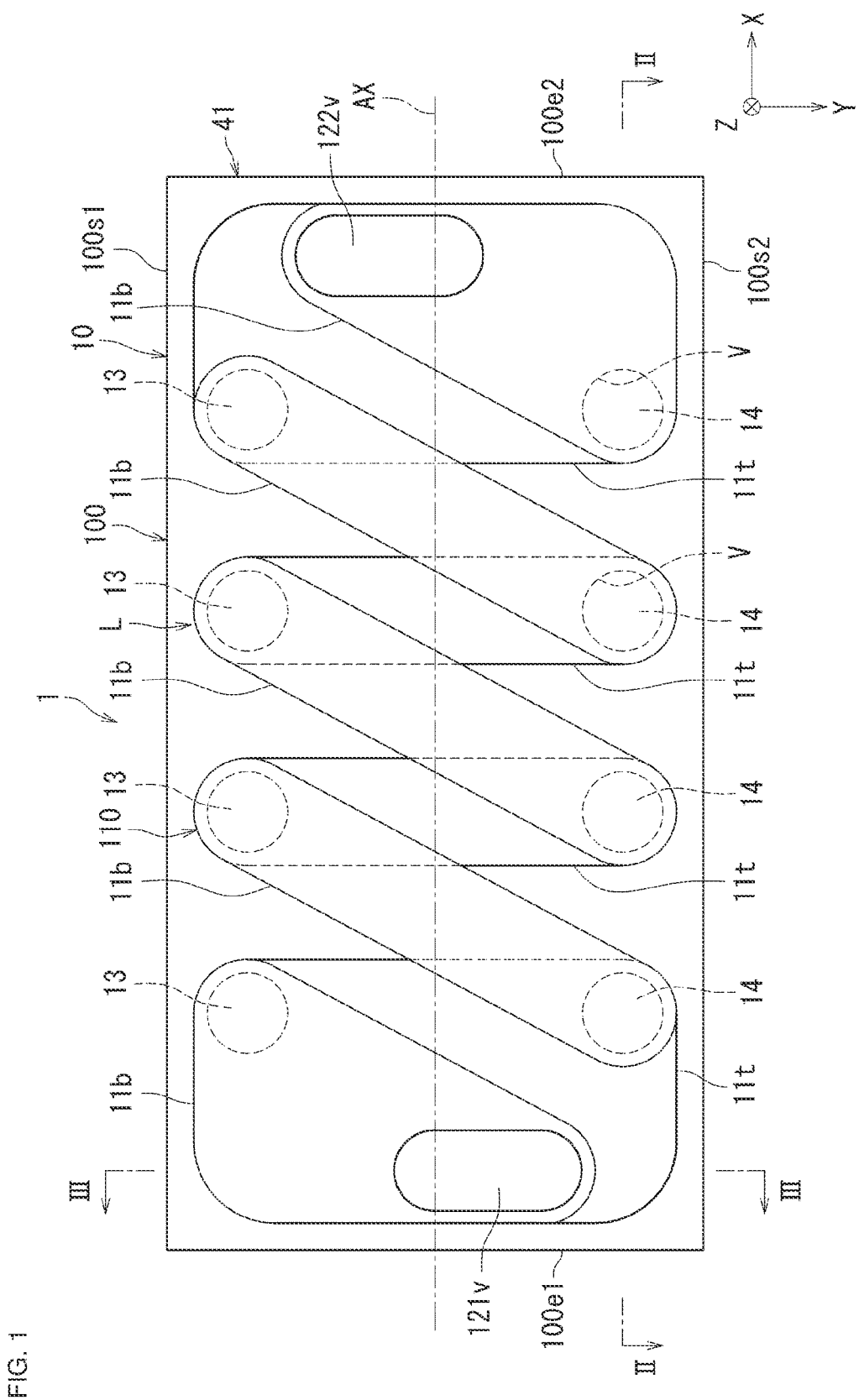
FIG. 1 is a schematic bottom view illustrating a first embodiment of a passive component viewed from a bottom surface side.
Figure 2:
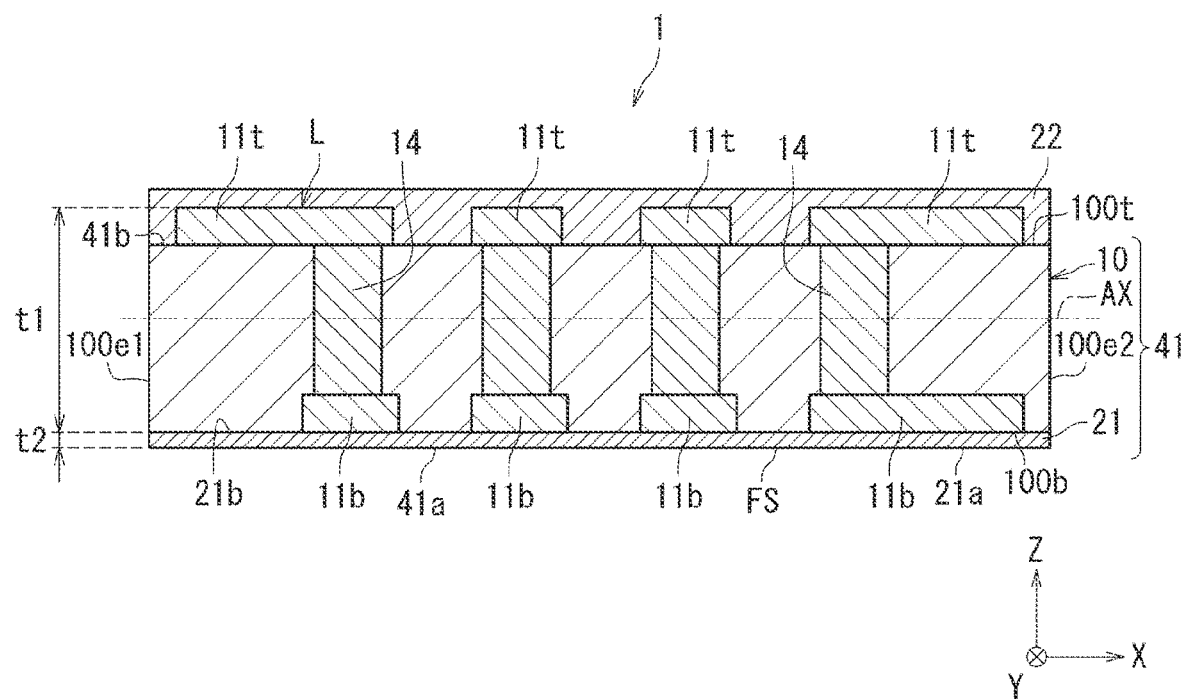
FIG. 2 is a cross-sectional view taken along a line II-II of FIG. 1.
Figure 3:
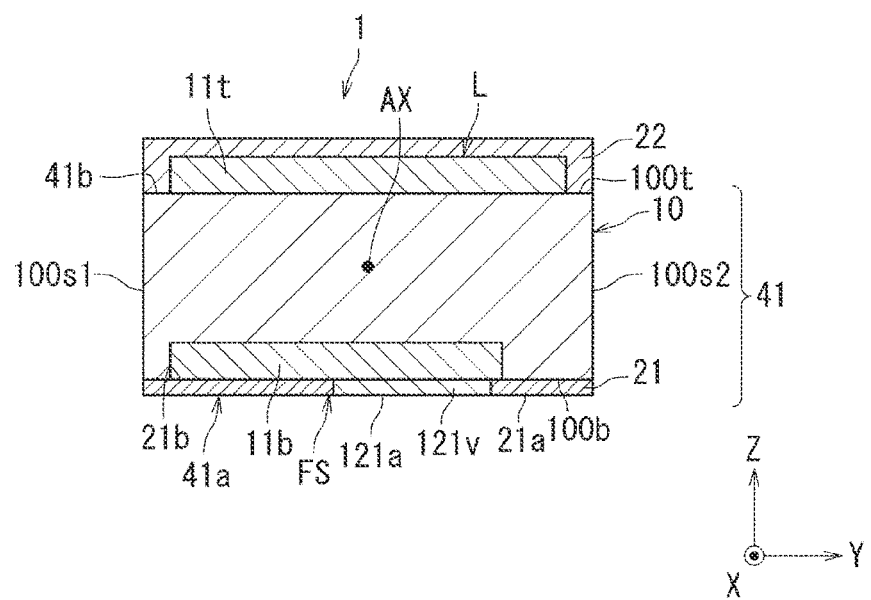
FIG. 3 is a cross-sectional view taken along a line III-III of FIG. 1.

FIG. 1 is a schematic bottom view of a passive component 1 viewed from the bottom surface side. FIG. 2 is a cross-sectional view taken along a line II-II of FIG. 1. FIG. 3 is a cross-sectional view taken along a line III-III of FIG. 1. Note that for the sake of convenience, in FIG. 1, an element body 10 is drawn to be transparent so that the structure can be easily understood, but may be translucent or opaque. Further, in FIG. 1, an insulator and an inorganic layer are omitted.

The passive component 1 is, for example, a surface-mount passive component used in a high-frequency signal transmission circuit. The passive component 1 is an electronic component such as a resistor, a capacitor, or an inductor, and does not include an active element such as a transistor. In this embodiment, the passive component 1 is an inductor. As illustrated in FIG. 1 to FIG. 3, the passive component 1 includes a body portion 41 having a first main surface 41a and a second main surface 41b facing each other, and a passive element at least a part of which is provided inside the body portion 41. The passive element is an inductor element L. That is, the passive component includes the element body, the internal wiring, and the like, and the passive element represents, for example, a coil or the like in the passive component and does not include the element body or the like. The passive element includes an inductor element, a capacitor element, and a resistor element, and one of the inductor elements which includes a conductor winding around a central axis in a specific direction is defined as a coil.

The body portion 41 holds the inductor element L. The shape of the body portion 41 is not particularly limited, and is a substantially rectangular parallelepiped shape in this embodiment. The body portion 41 has a length, a width, and a height. The body portion 41 has a first end surface and a second end surface on both end sides in the length direction, a first side surface and a second side surface on both end sides in the width direction, and a bottom surface and a top surface on both end sides in the height direction. In this embodiment, the bottom surface of the body portion 41 is the first main surface 41a of the body portion 41, and the top surface of the body portion 41 is the second main surface 41b of the body portion 41.

The first main surface 41a of the body portion 41 at least partially includes a flat surface FS. The flat surface FS is made of an inorganic substance. In this embodiment, the entire first main surface 41a is the flat surface FS made of an inorganic substance. However, the present disclosure is not limited thereto, and only a part of the first main surface 41a may be the flat surface FS made of an inorganic substance. The other part of the first main surface 41a may be made of, for example, an organic substance and need not be the flat surface FS. Preferably, the area of the flat surface FS is equal to or greater than half the area of the first main surface 41a of the body portion 41. Thus, when the passive component 1 is bonded to another electronic component or the like via the flat surface FS, the bonding strength can be increased.

In this specification, the term "flat" of the "flat surface" refers to a state in which the surface roughness of the flat surface is smaller than any one of equal to or less than $1/1000$ of the thickness of the body portion of the passive component (the thickness of the body portion in a direction orthogonal to the first main surface of the body portion) and equal to or less than 10 nm. The "surface roughness" is Sa (arithmetic average height). "Flat" means, for example, a state in which Sa is 0.2 nm. An atomic force microscope (AFM) is used for measurement of Sa. The surface roughness is an average value of Sa at five points on the component surface.

Examples of the "inorganic substance" include Si, SiN, SiO$_2$, Ge, GaN, GaP, GaAs, InP, Ti, TiN, Al, Au, Sn, Ta, Cu, and the like. According to this, the first main surface 41a of the body portion 41 is easily flattened compared with a case where the first main surface 41a of the body portion 41 is made of an organic substance. In addition, the hardness of the flat surface FS is high and the strength of the passive component 1 can be increased.

According to the passive component 1, since the first main surface 41a of the body portion 41 at least partially includes the flat surface FS made of an inorganic substance, when the passive component 1 is bonded to another electronic component or the like having the flat surface FS, the flat surfaces FS can be bonded in a state of being in contact with each other. Therefore, it is possible to reduce the thickness of the entire device such as a stacked semiconductor package.

Note that in this specification, "bonding in a state where the flat surfaces FS are in contact with each other" refers to room-temperature direct bonding by atomic diffusion or ionic bonding, hybrid bonding to which heat is applied, or the like. In addition, "bonding" may indicate a chemical bonding state such as a covalent bond, an ionic bond, or a metallic bond, or may refer to a mechanical bonding state.

2. Method for Manufacturing Passive Component 1

Next, a method for manufacturing the passive component 1 will be described.

As illustrated in FIG. 2, an inorganic substrate 21 made of an inorganic substance and having a first main surface 21a and a second main surface 21b facing each other is prepared. Thereafter, the inductor element L is provided as a passive element on the second main surface 21b side of the inorganic substrate 21 to form the body portion 41 including the inorganic substrate 21 and a part of the inductor element L. Thereafter, the first main surface 21a of the inorganic substrate 21 is polished to provide the flat surface FS.

According to this, since the first main surface 21a of the inorganic substrate 21 includes the flat surface FS made of an inorganic substance, when the passive component 1 is bonded to another electronic component or the like having the flat surface FS, the flat surfaces FS can be bonded in a state of being in contact with each other. Therefore, it is possible to reduce the thickness of the entire device such as a stacked semiconductor package.

3. Preferred Embodiment

Passive Component 1

The passive component 1 includes the element body 10, a coil 110 provided on the element body 10 and spirally wound along an axis AX, the inorganic layer 21 provided on a first main surface (bottom surface 100b) of the element body 10, a first via wiring 121v and a second via wiring 122v penetrating the inorganic layer 21, and an insulator 22 provided on a second main surface (top surface 100t) of the element body 10. The coil 110 constitutes the inductor element L. The element body 10, the inorganic layer 21, the first via wiring 121v, and the second via wiring 122v constitute the body portion 41. The first via wiring 121v and the second via wiring 122v correspond to "through-wirings" described in the claims.

The element body 10 has a length, a width, and a height. The element body 10 has a first end surface 100e1 and a second end surface 100e2 on both end sides in the length direction, a first side surface 100s1 and a second side surface 100s2 on both end sides in the width direction, and the bottom surface 100b and the top surface 100t on both end sides in the height direction. In other words, an outer surface 100 of the element body 10 includes the first end surface 100e1 and the second end surface 100e2, the first side surface 100s1 and the second side surface 100s2, and the bottom surface 100b and the top surface 100t. The first end surface 100e1, the second end surface 100e2, the first side surface 100s1, and the second side surface 100s2 constitute a part of the first end surface, a part of the second end surface, a part of the first side surface, and a part of the second side surface of the body portion 41 described above, respectively. The top surface 100t constitutes the top surface of the body portion 41 described above.

Note that as illustrated in the accompanying drawings, hereinafter, for convenience of description, the length direction (longitudinal direction) of the element body 10 is referred to as an X direction, a direction from the first end surface 100e1 toward the second end surface 100e2 is referred to as a forward X direction, and a direction opposite to the forward X direction is referred to as a reverse X direction. In addition, the width direction of the element body 10 is referred to as a Y direction, a direction from the first side surface 100s1 toward the second side surface 100s2 is referred to as a forward Y direction, and a direction opposite to the forward Y direction is referred to as a reverse Y direction. In addition, a height direction of the element body 10 is referred to as a Z direction, a direction from the bottom surface 100b toward the top surface 100t is referred to as a forward Z direction, and a direction opposite to the forward Z direction is referred to as a reverse Z direction. In this specification, the forward Z direction is defined as the upper side and the reverse Z direction is defined as the lower side. The X direction, the Y direction, and the Z direction are directions orthogonal to each other, and constitute a right-handed system when arranged in the order of X, Y, and Z.

In this specification, the "outer surface 100 of the element body" including the first end surface 100e1, the second end surface 100e2, the first side surface 100s1, the second side surface 100s2, the bottom surface 100b, and the top surface 100t of the element body 10 does not simply mean a surface facing the outer peripheral side of the element body 10 but is a surface serving as a boundary between the outer side portion and the inner side portion of the element body 10. In addition, "above the outer surface 100 of the element body 10" does not refer to one absolute direction such as vertically above defined in the gravity direction, but refers to a direction toward the outer side portion, of the outer side portion and the inner side portion with the outer surface 100 as a boundary, with reference to the outer surface 100. Therefore, "above the outer surface 100" is a relative direction determined by an orientation of the outer surface 100. In addition, the expression "above" an element includes not only a position above the element at a distance, that is, a position above the element via another object or a position above the element with a space therebetween, but also a position (on) immediately above the element in contact with the element.

The axis AX of the coil 110 is arranged parallel to the bottom surface 100b. In other words, the coil 110 has the central axis AX parallel to the first main surface 41a of the body portion 41. According to this configuration, when the first main surface 41a of the body portion 41 is set as a mounting surface, the magnetic flux generated from the coil 110 is not directed to the mounting surface, and thus the inductor element L having a high Q value can be obtained.

The coil 110 includes a plurality of first coil wirings (bottom surface wirings 11b) provided on the bottom surface 100b side with respect to the axis AX and arranged along the axis AX on a plane parallel to the bottom surface 100b, a plurality of second coil wirings (top surface wirings 11t) provided on the top surface 100t side with respect to the axis AX and arranged along the axis AX on a plane parallel to the top surface 100t, a plurality of first through-wirings 13 extending from the bottom surface wiring 11b toward the top surface wiring 11t and arranged along the axis AX, and a plurality of second through-wirings 14 extending from the bottom surface wiring 11b toward the top surface wiring 11t, provided on the side opposite to the first through-wiring 13 with respect to the axis AX, and arranged along the axis AX. The bottom surface wiring 11b, the first through-wiring 13, the top surface wiring 11t, and the second through-wiring 14 are connected in this order to form at least a part of a spiral shape.

The axis AX is a line of intersection between a first plane passing through the center between the bottom surface wiring 11b and the top surface wiring 11t and a second plane passing through the center between the first through-wiring 13 and the second through-wiring 14. That is, the axis AX is a straight line passing through the center of the inner diameter portion of the coil 110. The axis AX of the coil 110 does not have a dimension in a direction orthogonal to the axis AX.

The volume of the passive component 1 is equal to or less than 0.08 mm$^3$, and the size of the long side of the passive component 1 is equal to or less than 0.65 mm. The size of the long side of the passive component 1 refers to the largest value of the length, the width, and the height of the passive component 1, and refers to the length in the X direction in this embodiment. According to the above configuration, since the volume of the passive component 1 is small and the long side of the passive component 1 is also short, the weight of the passive component 1 can be reduced. In addition, the thickness of the passive component 1 is preferably equal to or less than 200 km. Thus, the passive component 1 can be made thin.

To be specific, the size (length (X direction)×width (Y direction)×height (Z direction)) of the passive component 1 is 0.6 mm×0.3 mm×0.3 mm, 0.4 mm×0.2 mm×0.2 mm, 0.25 mm×0.125 mm×0.120 mm or the like. Further, the width and the height need not be equal to each other, and may be, for example, 0.4 mm×0.2 mm×0.3 mm or the like.

Element Body 10

The element body 10 is made of an insulating resin. As the insulating resin, for example, a photosensitive permanent film (permanent photoresist) or an insulating resin containing an inorganic filler is used. A photosensitive permanent film is a photoresist that is not removed after processing.

Note that the element body 10 may be made of, for example, a glass sintered body or a glass substrate. The glass substrate may be a single-layer glass substrate, and since most of the element body is made of glass, loss such as eddy current loss at high frequencies can be suppressed.

Coil 110

The coil 110 includes a plurality of bottom surface wirings 11b, a plurality of top surface wirings 11t, a plurality of first through-wirings 13, and a plurality of second through-wirings 14. The bottom surface wiring 11b, the first through-wiring 13, the top surface wiring 11t, and the second through-wiring 14 are connected in order and constitute at least a part of the coil 110 wound in the axis AX direction.

According to the above-described configuration, since the coil 110 is the coil 110 having a so-called helical shape, it is possible to reduce a region in which the bottom surface wiring 11b, the top surface wiring 11t, the first through-wiring 13, and the second through-wiring 14 run in parallel along the winding direction of the coil 110 in the cross section orthogonal to the axis AX, and it is possible to reduce stray capacitance in the coil 110.

Here, the helical shape refers to a shape in which the number of turns of the entire coil is greater than one turn and the number of turns of the coil in a cross section orthogonal to the axis is less than one turn. The term "one turn or more" refers to a state having a portion in which the wirings of the coil adjacent to each other in the radial direction run in parallel in the winding direction when viewed in the axial direction in a cross section orthogonal to the axis, and the term "less than one turn" refers to a state that does not have a portion in which the wirings of the coil adjacent to each other in the radial direction run in parallel in the winding direction when viewed in the axial direction in a cross section orthogonal to the axis.

The bottom surface wiring 11b extends in the Y direction while being slightly inclined in the X direction. The bottom surface wiring 11b is embedded in the element body 10 so as to be exposed from the bottom surface 100b. The plurality of bottom surface wirings 11b is arranged in parallel along the X direction. When viewed from a direction orthogonal to the bottom surface 100b, the bottom surface wirings 11b at both ends in the axis AX direction are formed in a triangular shape, and the other bottom surface wirings 11b are formed in a linear shape.

The top surface wiring 11t has a shape extending in the Y direction. The top surface wiring 11t is provided on the top surface 100t. The plurality of top surface wirings 11t is arranged in parallel along the X direction. When viewed from a direction orthogonal to the bottom surface 100b, the top surface wirings 11t at both ends in the axis AX direction are formed in a quadrangular shape, and the other top surface wirings 11t are formed in a linear shape.

The bottom surface wiring 11b and the top surface wiring 11t are made of a good conductor material such as Cu, Ag, Au, or alloys thereof. The bottom surface wiring 11b and the top surface wiring 11t may be a metallic film formed by plating, vapor deposition, sputtering, or the like, or may be a metallic sintered body obtained by applying and sintering conductive paste. Further, the bottom surface wiring 11b and the top surface wiring 11t may have a multilayer structure in which a plurality of metallic layers is stacked. The thicknesses of the bottom surface wiring 11b and the top surface wiring 11t are preferably equal to or more than 5 μm and equal to or less than 50 μm (i.e., from 5 μm to 50 μm).

The first through-wiring 13 is arranged on the first side surface 100s1 side with respect to the axis AX in a through-hole V of the element body 10, and the second through-wiring 14 is arranged on the second side surface 100s2 side with respect to the axis AX in the through-hole V of the element body 10. The first through-wiring 13 and the second through-wiring 14 extend in a direction orthogonal to the bottom surface 100b and the top surface 100t, respectively. According to this configuration, since the lengths of the first through-wiring 13 and the second through-wiring 14 can be shortened, the direct-current resistance (Rdc) can be suppressed. All the first through-wirings 13 and all the second through-wirings 14 are arranged parallel to each other along the X direction. The first through-wiring 13 and the second through-wiring 14 are made of the same material as the bottom surface wiring 11b and the top surface wiring 11t.

Inorganic Layer 21

The inorganic layer 21 is provided on the bottom surface 100b of the element body 10 and covers the exposed portion of the bottom surface wiring 11*b* from the bottom surface 100*b*. Thus, the bottom surface wiring 11*b* is protected from an external force, the bottom surface wiring 11*b* is prevented from being damaged, and the insulating property of the bottom surface wiring 11*b* is improved. The inorganic layer 21 is made of an inorganic substance. The inorganic substance is, for example, Si, SiN, SiO$_2$, Ge, GaN, GaP, GaAs, InP, Ti, TiN, Al, Au, Sn, Ta, Cu, or the like, similar to the above-described inorganic substance of the flat surface FS. The inorganic layer 21 has the first main surface 21*a* and the second main surface 21*b* facing each other. The first main surface 21*a* of the inorganic layer 21 constitutes a part of the first main surface 41*a* of the body portion 41. The second main surface 21*b* is in contact with the bottom surface 100*b* of the element body 10.

Insulator 22

The insulator 22 is provided on the top surface 100*t* of the element body 10 and covers the top surface wiring 11*t*. Thus, the top surface wiring 11*t* is protected from an external force, the top surface wiring 11*t* is prevented from being damaged, and the insulating property of the top surface wiring 11*t* is improved. The insulator 22 is preferably an organic insulator. For example, the insulator 22 may be a resin film such as an epoxy-based or a polyimide-based resin film that can be easily formed.

First Via Wiring 121*v* and Second Via Wiring 122*v*

The first via wiring 121*v* is connected to a first end portion of the coil 110, and the second via wiring 122*v* is connected to a second end portion of the coil 110. That is, the first via wiring 121*v* and the second via wiring 122*v* are not included in the coil 110. The first via wiring 121*v* is provided on the first end surface 100*e*1 side with respect to the center of the element body 10 in the X direction. The second via wiring 122*v* is provided on the second end surface 100*e*2 side with respect to the center of the element body 10 in the X direction.

The first via wiring 121*v* is embedded in the inorganic layer 21 and exposed from the first main surface 21*a* of the inorganic layer 21. The first via wiring 121*v* penetrates the inorganic layer 21 from the first main surface 21*a* to the second main surface 21*b* of the inorganic layer 21. The first via wiring 121*v* is connected to an end portion of the bottom surface wiring 11*b* located on the first end surface 100*e*1 side in the axis AX direction.

The second via wiring 122*v* is embedded in the inorganic layer 21 and exposed from the first main surface 21*a* of the inorganic layer 21. The second via wiring 122*v* penetrates the inorganic layer 21 from the first main surface 21*a* to the second main surface 21*b* of the inorganic layer 21. The second via wiring 122*v* is connected to an end portion of the bottom surface wiring 11*b* located on the second end surface 100*e*2 side in the axis AX direction.

Preferably, the first main surface 21*a* of the inorganic layer 21, the exposed surface 121*a* of the first via wiring 121*v* exposed from the first main surface 21*a* of the inorganic layer 21, and an exposed surface of the second via wiring 122*v* (not illustrated) exposed from the first main surface 21*a* of the inorganic layer 21 constitute the first main surface 41*a* of the body portion 41. According to this configuration, an electric signal can be extracted from the passive component 1 through the first via wiring 121*v* and the second via wiring 122*v*.

Preferably, the first via wiring 121*v* and the second via wiring 122*v* are made of an inorganic substance, and an exposed surface 121*a* of the first via wiring 121*v* exposed from the first main surface 21*a* of the inorganic layer 21 and an exposed surface (not illustrated) of the second via wiring 122*v* exposed from the first main surface 21*a* of the inorganic layer 21 constitute at least a part of the flat surface FS. The inorganic substance in the first via wiring 121*v* and the second via wiring 122*v* is, for example, a conductive material selected from Si, SiN, SiO$_2$, Ge, GaN, GaP, GaAs, InP, Ti, TiN, Al, Au, Sn, Ta, Cu, and the like. When the first via wiring 121*v* and the second via wiring 122*v* are made of an inorganic substance, it is preferable that the first via wiring 121*v* and the second via wiring 122*v* do not include a void from the viewpoint of reducing the electrical resistance.

According to the above-described configuration, since the exposed surfaces of the first via wiring 121*v* and the second via wiring 122*v* are flat surfaces, when it is bonded to another electronic component or the like having a flat surface, in the case where a part of the wiring is exposed from the flat surface in the other electronic component and the exposed surface is also a flat surface, the wiring of the other electronic component can be directly connected to the first via wiring 121*v* and the second via wiring 122*v*.

Preferably, the inorganic layer 21 is amorphous or single crystal. A scanning transmission electron microscope (STEM), an X-ray diffractometer (XRD), or the like is used to determine whether it is amorphous or single crystal. According to this configuration, the flat surface FS can be easily obtained. In the case where the inorganic layer 21 is a sintered body of ferrite or the like, unevenness may occur on the first main surface 21*a* of the inorganic layer 21.

Preferably, the body portion 41 includes the inorganic layer 21 made of an inorganic substance and having the first main surface 21*a* and the second main surface 21*b* facing each other and an organic insulating layer provided on the second main surface 21*b* of the inorganic layer 21, the first main surface 21*a* of the inorganic layer 21 constitutes at least a part of the first main surface 41*a* of the body portion 41, the passive element includes the inductor element L having the coil 110, and the coil 110 is in contact with both the inorganic layer 21 and the organic insulating layer. Specifically, as illustrated in FIG. 2, preferably, the element body 10 is made of an organic insulating layer, and the coil 110 is in contact with both the inorganic layer 21 and the organic insulating layer of the element body 10.

According to the above-described configuration, since the organic insulating layer of the element body 10 can support the coil 110, the diameter of the coil 110 can be increased. In addition, since the inorganic layer 21 has a coefficient of linear expansion smaller than that of the organic insulating layer of the element body 10, the stress of the body portion 41 can be relaxed as compared with the case where the coil 110 is in contact with only the organic insulating layer of the element body 10.

Preferably, the body portion 41 includes the inorganic layer 21 having the first main surface 21*a* and the second main surface 21*b* facing each other, the first main surface 21*a* of the inorganic layer 21 constitutes at least a part of the first main surface 41*a* of the body portion 41, and the thickness of the inorganic layer 21 in the direction (Z direction) orthogonal to the first main surface 41*a* of the body portion 41 is smaller than the thickness of the passive element in the direction orthogonal to the first main surface 41*a* of the body portion 41. According to this configuration, the passive component 1 can be made thinner.

Preferably, as illustrated in FIG. 2, the body portion 41 includes the inorganic layer 21 made of an inorganic substance and having the first main surface 21*a* and the second main surface 21*b* facing each other, the first main surface 21*a* of the inorganic layer 21 constitutes at least a part of the first main surface 41*a* of the body portion 41, the passive element includes the coil 110 having the central axis parallel to the first main surface 41a of the body portion 41, and a thickness t2 of the inorganic layer 21 in a direction orthogonal to the first main surface 41a of the body portion 41 is smaller than a thickness t1 of the coil 110 in a direction orthogonal to the first main surface 41a of the body portion 41. According to this configuration, the passive component 1 including the inductor element L can be made thinner.

Preferably, the body portion 41 has the second main surface 41b opposed to the first main surface 41a, and further includes the insulator 22 which is made of an organic insulating resin and provided on the second main surface 41b of the body portion 41, at least a part of the passive element is exposed from the second main surface 41b of the body portion 41, and an exposed portion of the passive element exposed from the second main surface 41b of the body portion 41 is covered with the insulator 22. Specifically, as illustrated in FIG. 2, the insulator 22 is made of an organic insulating resin, and the top surface wiring 11t of the coil 110 of the inductor element L is exposed from the second main surface 41b of the body portion 41 and is covered with the insulator 22. According to this configuration, since the insulating member 22 is made of an organic insulating resin, adhesion of the insulator 22 to the top surface wiring 11t is improved, and the inductor element L can be more effectively protected from the external environment.

Method for Manufacturing Passive Component 1

Next, a method for manufacturing the passive component 1 will be described with reference to FIG. 4A to FIG. 4K. FIG. 4A, FIG. 4B, FIG. 4C, FIG. 4J, and FIG. 4K are views corresponding to the III-III cross section of FIG. 1. FIG. 4D to FIG. 4I are views corresponding to the II-II cross section of FIG. 1.

Figure 4A:
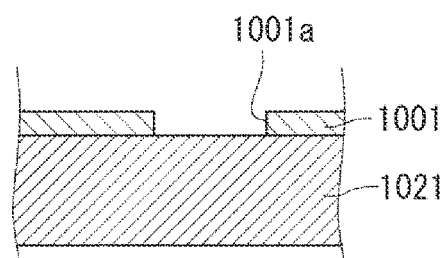
FIG. 4A is a schematic cross-sectional view illustrating a method for manufacturing a passive component.

As illustrated in FIG. 4A, an inorganic substrate 1021 corresponding to the inorganic layer 21 is prepared. The inorganic substrate 1021 is, for example, an Si substrate. A first resist layer 1001 is applied to the upper surface of the inorganic substrate 1021, and a cavity 1001a having a predetermined pattern is formed in the first resist layer 1001 by a photolithography process.

Figure 4B:
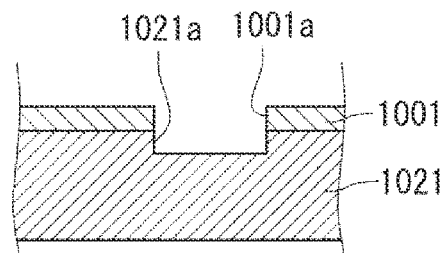
FIG. 4B is a schematic cross-sectional view illustrating the method for manufacturing the passive component.

As illustrated in FIG. 4B, the inorganic substrate 1021 is etched through the cavity 1001a to form a groove 1021a. The etching may be either dry etching or wet etching. In the present embodiment, since an Si substrate is used as the inorganic substrate 1021, plasma etching using a fluorine-based gas is used.

Figure 4C:
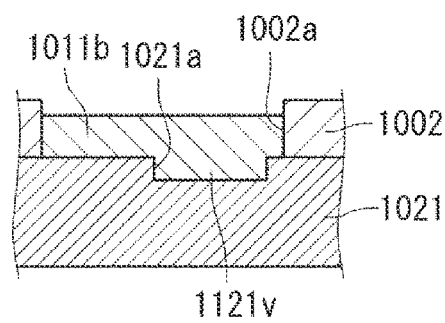
FIG. 4C is a schematic cross-sectional view illustrating the method for manufacturing the passive component.
Figure 4D:
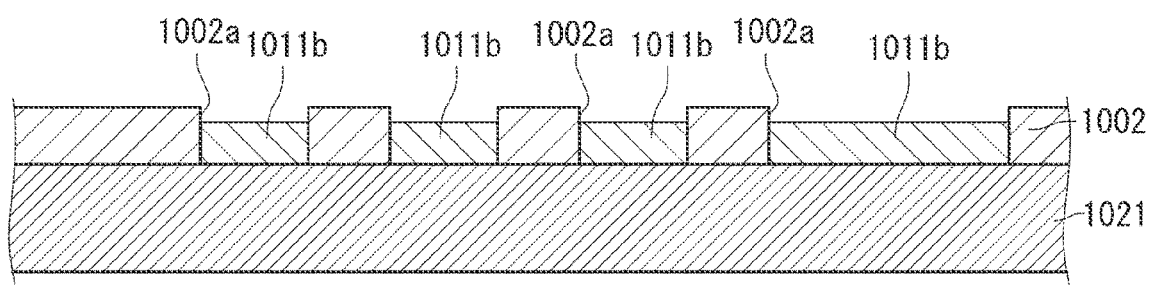
FIG. 4D is a schematic cross-sectional view illustrating the method for manufacturing the passive component.

Thereafter, the first resist layer 1001 is peeled off, a seed layer (not illustrated) is formed on the upper surface of the inorganic substrate 1021 as illustrated in FIG. 4C and FIG. 4D, a second resist layer 1002 is applied on the upper surface of the seed layer, and a cavity 1002a having a predetermined pattern is formed in the second resist layer 1002 by the photolithography process. Then, by electrolytic plating, a bottom surface conductor layer 1011b corresponding to the bottom surface wiring 11b is provided in the cavity 1002a, and a first via conductor layer 1121v corresponding to the first via wiring 121v is provided in the groove 1021a. In addition, although not illustrated, a second via conductor layer corresponding to the second via wiring 122v is provided in the same manner as the first via conductor layer 1121v.

Although a semi-additive method is used as a method of forming the bottom surface conductor layer and the via conductor layer in the present embodiment, a known method such as a subtractive method, a full additive method, a damascene method, a dual damascene method, or a printing method of conductive paste may be used. In the present embodiment, Ti/Cu is used for the seed layer, but a seed species such as W, TiW, or Ag and a combination thereof may be selected as necessary.

Figure 4E:
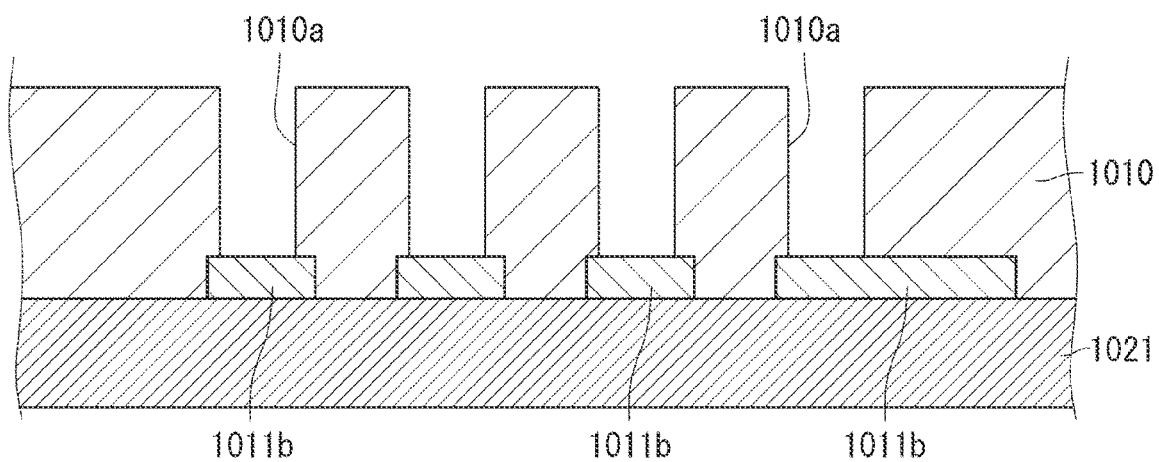
FIG. 4E is a schematic cross-sectional view illustrating the method for manufacturing the passive component.

Thereafter, the second resist layer 1002 is peeled off, and the seed layer is etched to provide an insulating resin layer 1010 corresponding to the element body 10 on the upper surface of the inorganic substrate 1021 as illustrated in FIG. 4E. A cavity 1010a having a predetermined pattern is formed in the insulating resin layer 1010 by a photolithography process, a part of the bottom surface conductor layer 1011b is exposed from the cavity 1010a, and the insulating resin layer 1010 is cured. In the present embodiment, a photosensitive permanent film is used as the insulating resin layer 1010, but for example, an insulating resin containing an inorganic filler may be used to form a cavity by a laser method or a blast method, or an inorganic insulating layer may be deposited by CVD or the like and a cavity may be formed by an etching method or the like.

Figure 4F:
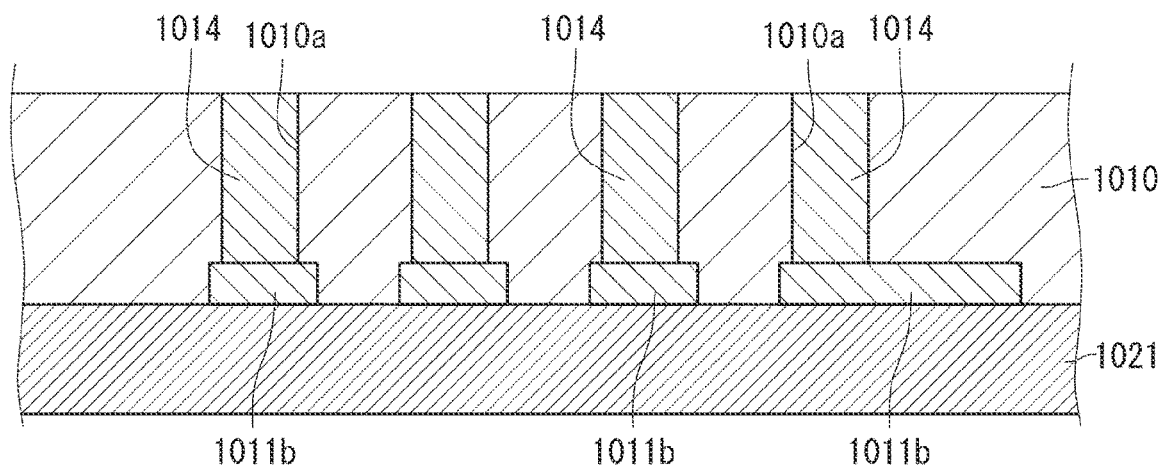
FIG. 4F is a schematic cross-sectional view illustrating the method for manufacturing the passive component.

As illustrated in FIG. 4F, a second through-conductor layer 1014 corresponding to the second through-wiring 14 is formed in the cavity 1010a of the insulating resin layer 1010. In addition, although not illustrated, a first through-conductor layer corresponding to the first through-wiring 13 is provided similar to the second through-conductor layer 1014. To be specific, in the present embodiment, a seed layer of Ti/Cu is formed on the upper surface of the insulating resin layer 1010 and the inner surface of the cavity 1010a by anisotropic sputtering. Thereafter, filling plating is performed, and the upper surface of the insulating resin layer 1010 is planarized by chemical mechanical polishing (CMP), mechanical polishing, or the like. In the case of mechanical polishing, the upper surface of the insulating resin layer 1010 is planarized by processing with dry etching or chemical etching after mechanical polishing in order to keep the surface roughness within a predetermined range. Note that as another method of forming the through-conductor layer, a conductive portion may be provided in the bottom surface conductor layer in advance, and power may be supplied from the conductive portion to form the through-conductor layer by an electrolytic plating method.

Figure 4G:
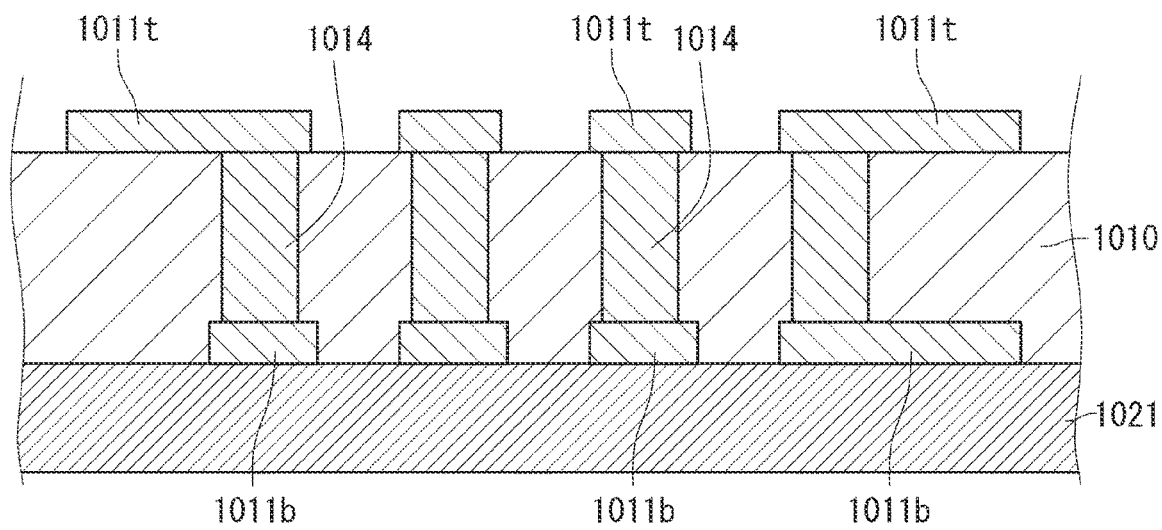
FIG. 4G is a schematic cross-sectional view illustrating the method for manufacturing the passive component.

Thereafter, a seed layer (not illustrated) is formed on the upper surface of the insulating resin layer 1010, a resist layer (not illustrated) is applied on the upper surface of the seed layer, and a cavity having a predetermined pattern is formed in the resist layer by a photolithography process. Then, a top surface conductor layer 1011t corresponding to the top surface wiring 11t is provided in the cavity by electrolytic plating, the resist layer is peeled off, and the seed layer is etched as illustrated in FIG. 4G.

Figure 4H:
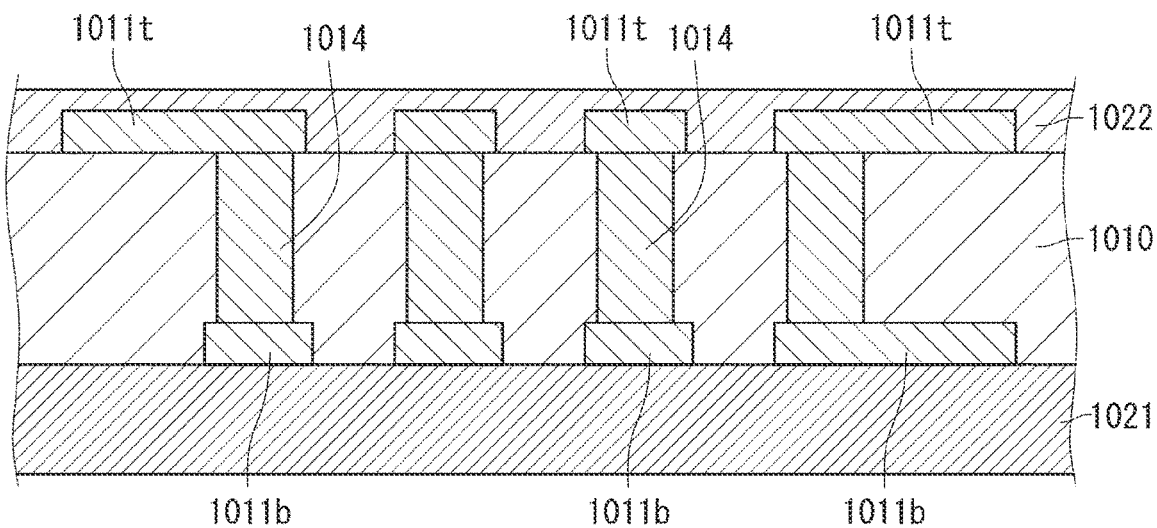
FIG. 4H is a schematic cross-sectional view illustrating the method for manufacturing the passive component.

As illustrated in FIG. 4H, an insulating layer 1022 corresponding to the insulator 22 is provided on the upper surface of the insulating resin layer 1010 so as to cover the top surface conductor layer 1011t, and the insulating layer 1022 is cured. The insulating layer 1022 may be the same resin as the insulating resin layer 1010, or may be different resin. Since the insulating layer 1022 is in contact with the outside, it is preferable to use resin having excellent water resistance or resin having high hardness as compared with the insulating resin layer 1010, and it is further preferable to use resin containing an inorganic filler or the like, whereby the insulating property is improved. Furthermore, the insulating layer 1022 is preferably formed using resin having the higher light-blocking property (shielding property) than the insulating resin layer 1010.

Figure 4I:
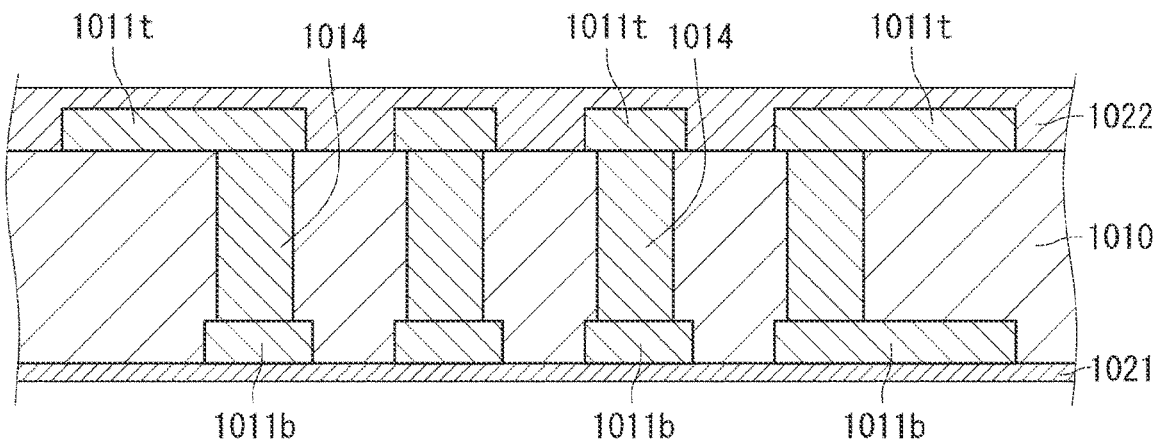
FIG. 4I is a schematic cross-sectional view illustrating the method for manufacturing the passive component.
Figure 4J:
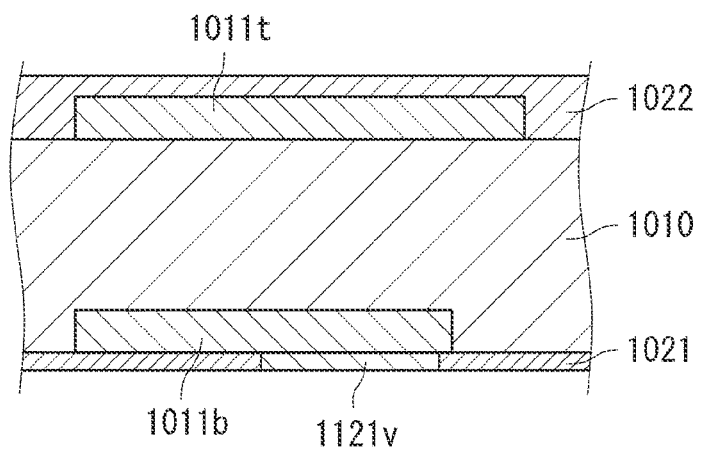
FIG. 4J is a schematic cross-sectional view illustrating the method for manufacturing the passive component.

As illustrated in FIG. 4I and FIG. 4J, the inorganic substrate 1021 is polished to expose the end surface of the first via conductor layer 1121v and the end surface of the second via conductor layer. CMP is preferred for polishing the inorganic substrate 1021. Note that when necessary, the insulating layer 1022 may be polished for adjustment of thickness.

Figure 4K:
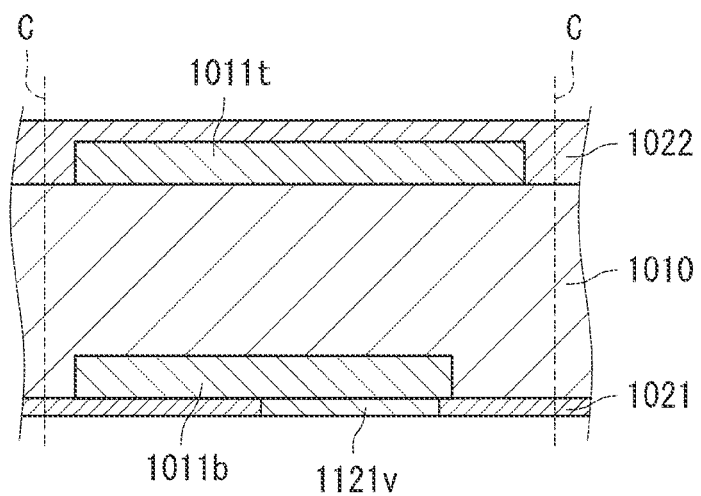
FIG. 4K is a schematic cross-sectional view illustrating the method for manufacturing the passive component.

As illustrated in FIG. 4K, singulation is performed along a cut line C. Thus, as illustrated in FIG. 3, the passive component 1 is manufactured.

Second Embodiment

Configuration of Passive Component 1A

Figure 5:
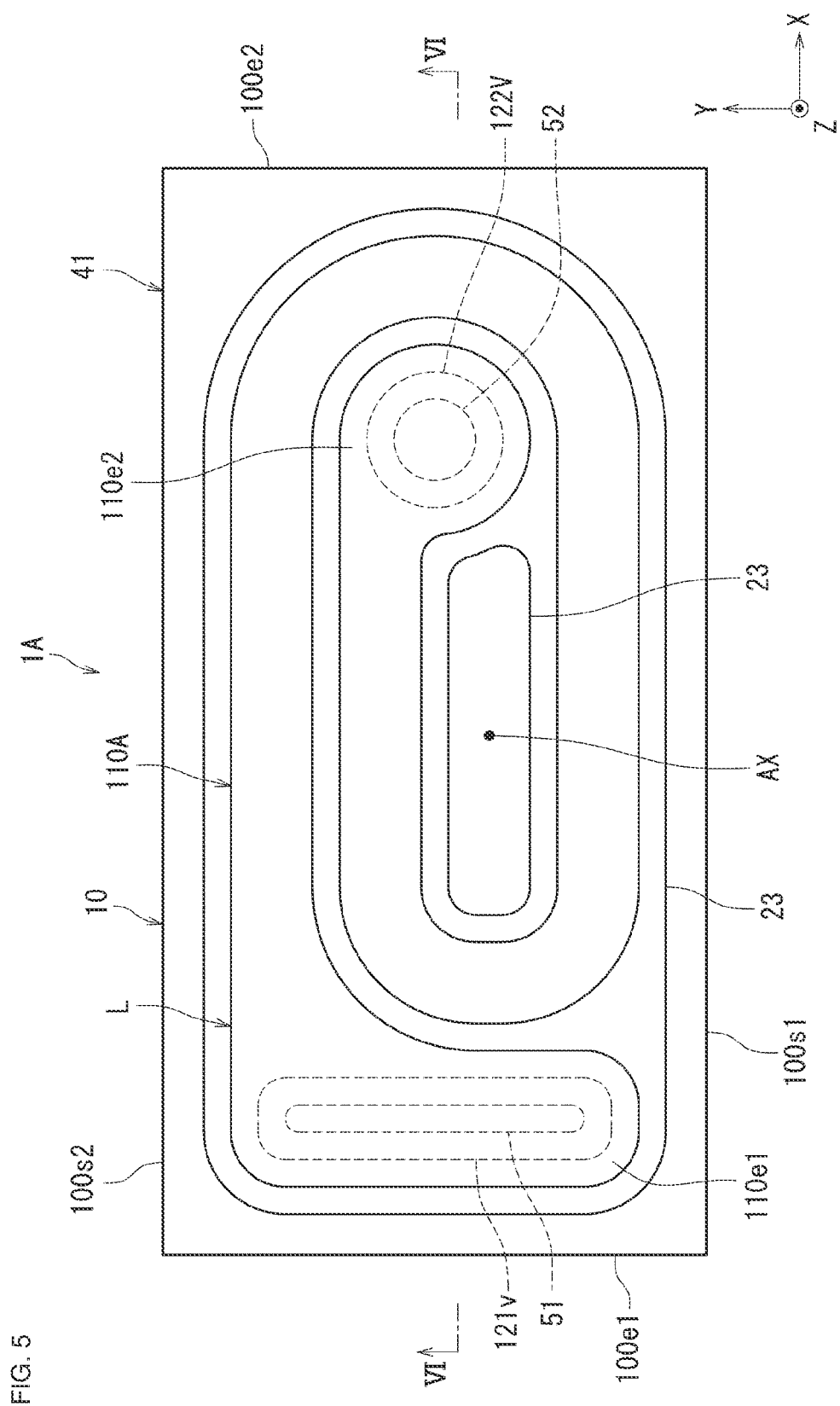
FIG. 5 is a schematic top view illustrating a second embodiment of a passive component viewed from a top surface side.
Figure 6:
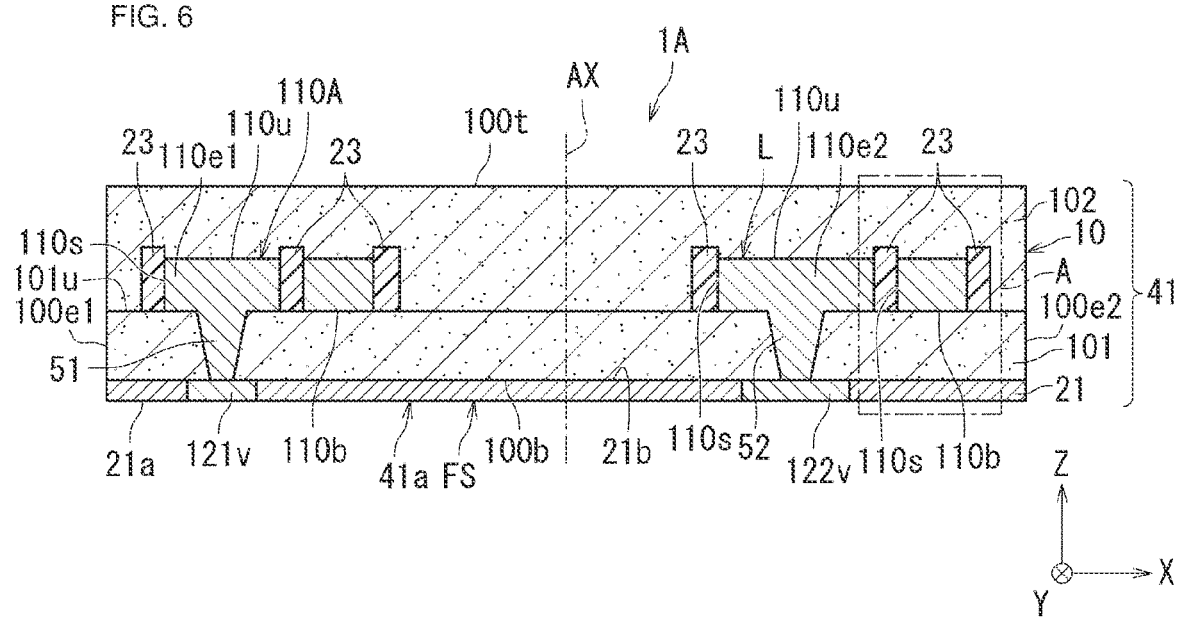
FIG. 6 is a cross-sectional view taken along a line VI-VI of FIG. 5.
Figure 7:
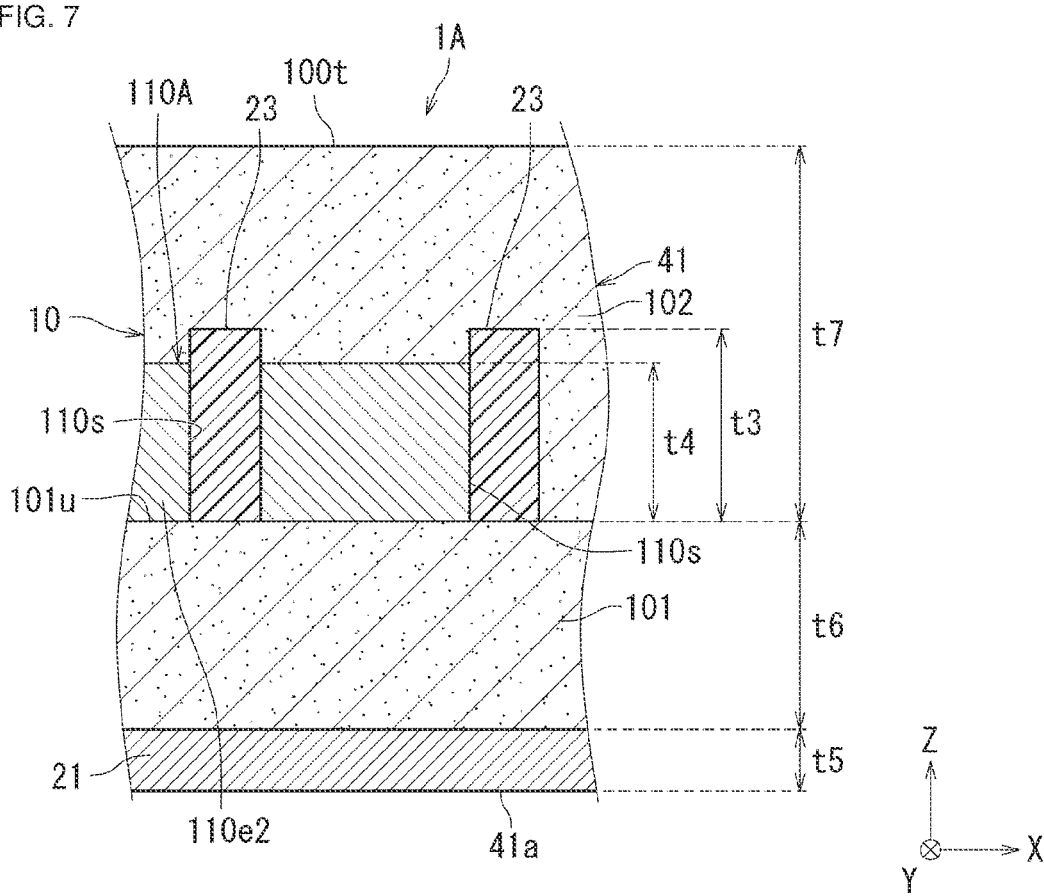
FIG. 7 is an enlarged view of part A of FIG. 6.

FIG. 5 is a schematic top view illustrating a second embodiment of the passive component viewed from the top surface side. FIG. 6 is a cross-sectional view taken along a line VI-VI of FIG. 5. FIG. 7 is an enlarged view of part A of FIG. 6. The second embodiment is different from the first embodiment in the configuration of the coil and the configuration of the element body. This different configuration will be described below. The other configurations are the same as those of the first embodiment, and are denoted by the same reference signs as those of the first embodiment, and description thereof is omitted.

As illustrated in FIG. 5 to FIG. 7, a passive component 1A includes the element body 10, a coil 110A, an organic insulating portion 23, a first connection wiring 51, and a second connection wiring 52 provided inside the element body 10, and the inorganic layer 21 provided on the bottom surface 100b of the element body 10. The element body 10 includes a first magnetic layer 101 and a second magnetic layer 102 stacked in the forward Z direction. The lower surface of the second magnetic layer 102 corresponds to the bottom surface 100b of the element body 10. In this embodiment, the element body 10 corresponds to the "magnetic portion" recited in the claims.

The coil 110A is provided on an upper surface 101u of the first magnetic layer 101 and has a planar spiral shape. The coil 110A is spirally wound in the clockwise direction from an outer peripheral end 110e1 toward an inner peripheral end 110e2 when viewed from the Z direction. In other words, the coil 110A is wound along a plane parallel to the first main surface 41a of the body portion 41. The coil 110A has the central axis AX orthogonal to the first main surface 41a of the body portion 41. According to this configuration, the inductor element L can be made thinner than in the case where the coil 110A has the central axis parallel to the first main surface 41a of the body portion 41. As a result, the passive component 1A can be made thinner.

The number of turns of the coil 110A is preferably more than one. Thus, the inductance can be improved. The outer peripheral end 110e1 has a substantially rectangular shape. The inner peripheral end 110e2 has a substantially circular shape. Each of the width of the outer peripheral end 110e1 in the X direction and the diameter of the inner peripheral end 110e2 is larger than the wiring width of the winding portion of the coil 110A excluding the outer peripheral end 110e1 and the inner peripheral end 110e2. Accordingly, the outer peripheral end 110e1 and the inner peripheral end 110e2 function as pad portions, and the connection reliability with the first connection wiring 51 and the second connection wiring 52 is improved. The coil 110A does not include the first connection wiring 51, the second connection wiring 52, the first via wiring 121v, and the second via wiring 122v.

The coil 110A is covered with the element body 10 (magnetic portion). According to this configuration, the inductance of the inductor element L can be improved. The conductive material of the coil 110A may be the same as the conductive material of the bottom surface wiring 11b and the top surface wiring 11t in the first embodiment.

The organic insulating portion 23 is provided at least on a side surface 110s orthogonal to the first main surface 41a of the body portion 41 in the coil 110A. In this embodiment, the organic insulating portion 23 is provided on the outer peripheral surface of a portion of the coil 110A constituting one turn of the coil 110A including the outer peripheral end 110e1, on the inner peripheral surface of a portion of the coil 110A constituting one turn of the coil 110A including the inner peripheral end 110e2, and between respective turns of the coil 110A. The material of the organic insulating portion 23 is, for example, a photosensitive permanent film.

The element body 10 covers the coil 110A and the organic insulating portion 23. The coil 110A is in contact with the organic insulating portion 23 and the element body 10. To be specific, an upper surface 110u of the coil 110A is in contact with the second magnetic layer 102, a lower surface 110b of the coil 110A is in contact with the first magnetic layer 101, and the side surface 110s of the coil 110A is in contact with the organic insulating portion 23. According to this configuration, the inductance of the inductor element L can be improved by the element body 10, and the inter-wiring leakage in the XY plane can be suppressed by the organic insulating portion 23 provided on the side surface 110s of the coil 110A. In particular, since the organic insulating portion 23 is provided between the respective turns of the coil 110A, it is possible to suppress the inter-wiring leakage that may occur between the respective turns.

The first magnetic layer 101 and the second magnetic layer 102 are, for example, a composite material containing an epoxy resin, an Fe-based metal filler, and a glass filler. Whereby, it is possible to obtain high DC superposition characteristics while improving inductance, and it is possible to suppress cracks that may occur in the element body 10 by the epoxy resin. The resin of the first magnetic layer 101 and the second magnetic layer 102 is not limited to the epoxy resin, and may be imide-based resin, phenol-based resin, or the like. The Fe-based metal filler may be FeSi-based metal filler, FeCo-based metal filler, FeNi-based metal filler, or the like. In addition, for the first magnetic layer 101 and the second magnetic layer 102, magnetic materials formed by sputtering or the like may be used, or a magnetic block may be inserted into the core portion of the coil 110A.

The first connection wiring 51 penetrates the first magnetic layer 101 in the Z direction and connects the outer peripheral end 110e1 of the coil 110A and the first via wiring 121v. The second connection wiring 52 penetrates the first magnetic layer 101 in the Z direction and connects the inner peripheral end 110e2 of the coil 110A and the second via wiring 122v. According to this configuration, an electric signal of the coil 110A can be extracted via the first connection wiring 51 and the second connection wiring 52. The conductive material of the first connection wiring 51 and the second connection wiring 52 is not particularly limited, but is the same as the conductive material of the coil 110A, for example.

In this embodiment, the first main surface 41a of the body portion 41 includes the first main surface 21a of the inorganic layer 21 and the exposed surfaces of the first via wiring 121v and the second via wiring 122v from the first main surface 21a of the inorganic layer 21, and the entire first main surface 41a of the body portion 41 is the flat surface FS made of an inorganic substance. According to this configuration, when it is bonded to another electronic component or the like having the flat surface FS, the flat surfaces FS can be bonded in a state of being in contact with each other. Therefore, it is possible to reduce the thickness of the entire device such as a stacked semiconductor package.

Preferably, as illustrated in FIG. 7, a thickness t3 of the organic insulating portion 23 in a direction orthogonal to the first main surface 41a of the body portion 41 is greater than a thickness t4 of the coil 110A in a direction orthogonal to the first main surface 41a of the body portion 41. According to this configuration, the inter-wiring leakage in the XY plane can be further suppressed. In particular, the inter-wiring leakage that may occur between the respective turns can be further suppressed. The thickness t3 is, for example, 35 m. The thickness t4 is, for example, 30 km. A thickness t5 of the inorganic layer 21 is, for example, 1 km. A thickness t6 of the first magnetic layer 101 is, for example, 20 km. A thickness t7 of the second magnetic layer 102 is, for example, 50 km.

Method for Manufacturing Passive Component 1A

Next, a method for manufacturing the passive component 1A will be described with reference to FIG. 8A to FIG. 8I. FIG. 8A to FIG. 8I are views corresponding to the VI-VI cross section of FIG. 5.

Figure 8A:
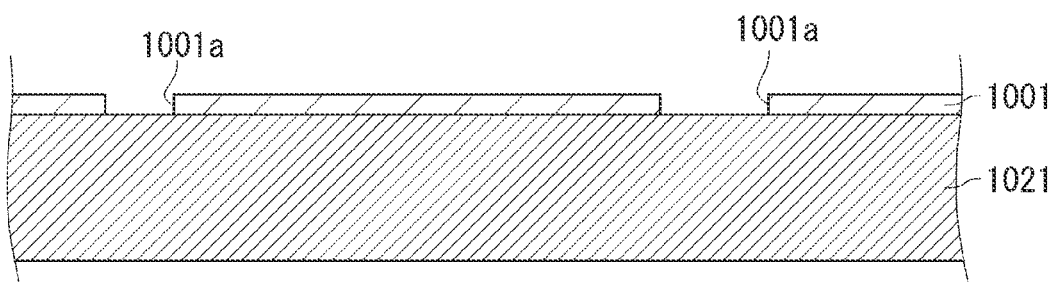
FIG. 8A is a schematic cross-sectional view illustrating a method for manufacturing a passive component.

As illustrated in FIG. 8A, the inorganic substrate 1021 corresponding to the inorganic layer 21 is prepared. The inorganic substrate 1021 is, for example, an Si substrate. A first resist layer 1001 is applied to the upper surface of the inorganic substrate 1021, and the cavity 1001a having a predetermined pattern is formed in the first resist layer 1001 by a photolithography process.

Figure 8B:
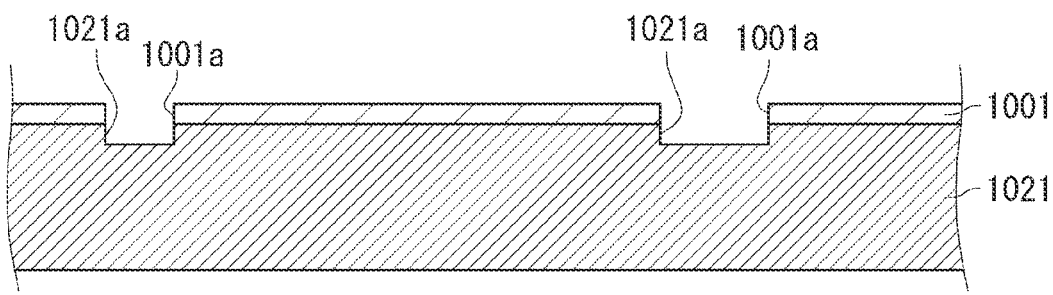
FIG. 8B is a schematic cross-sectional view illustrating the method for manufacturing the passive component.

As illustrated in FIG. 8B, the inorganic substrate 1021 is etched through the cavity 1001a to form the groove 1021a. The etching may be either dry etching or wet etching. In the present embodiment, since an Si substrate is used as the inorganic substrate 1021, plasma etching using a fluorine-based gas is used.

Figure 8C:
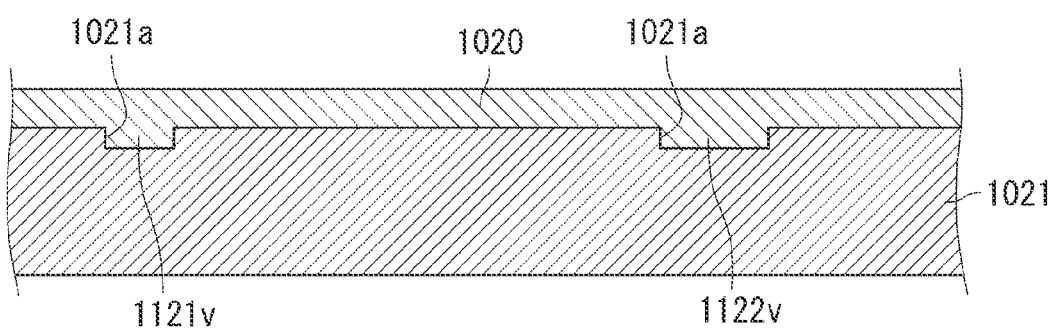
FIG. 8C is a schematic cross-sectional view illustrating the method for manufacturing the passive component.

As illustrated in FIG. 8C, the first resist layer 1001 is peeled off, a seed layer (not illustrated) is formed on the upper surface of the inorganic substrate 1021, and a conductive material of the first via wiring 121v and the second via wiring 122v is used to form a film (solid coating) on the upper surface of the seed layer by electrolytic plating so as to cover the groove 1021a. As a result, the first via conductor layer 1121v corresponding to the first via wiring 121v and a second via conductor layer 1122v corresponding to the second via wiring 122v are formed in the groove 1021a. Further, a solid film 1020 is formed on the upper surface of the inorganic substrate 1021. In the present embodiment, Ti/Cu is used for the seed layer, but a seed species such as W, TiW, or Ag and a combination thereof may be selected as necessary.

Figure 8D:
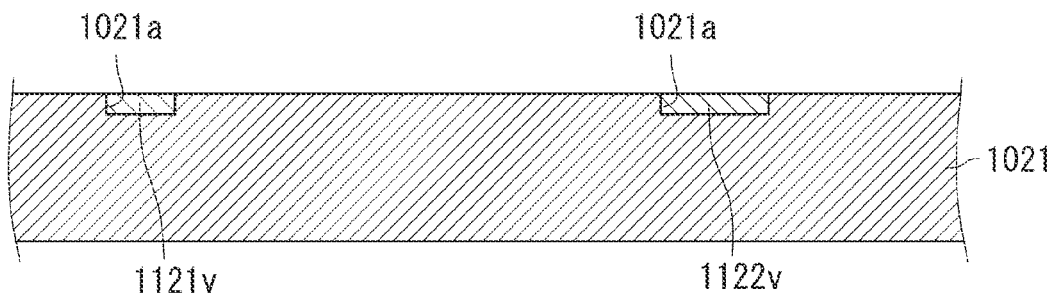
FIG. 8D is a schematic cross-sectional view illustrating the method for manufacturing the passive component.

As illustrated in FIG. 8D, the solid film 1020 is removed by etching. The solid film 1020 may be removed by CMP or polishing.

Figure 8E:
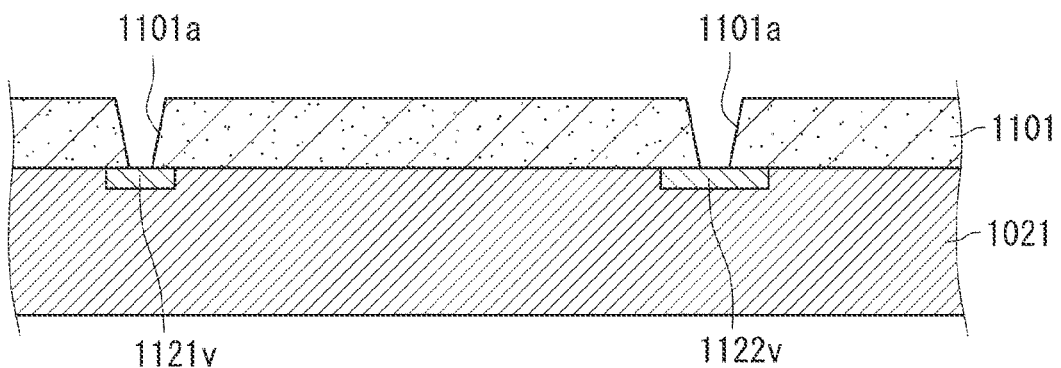
FIG. 8E is a schematic cross-sectional view illustrating the method for manufacturing the passive component.

As illustrated in FIG. 8E, a first magnetic sheet 1101 corresponding to the first magnetic layer 101 is performed thermocompression bonding to the upper surface of the inorganic substrate 1021. Thereafter, the first magnetic sheet 1101 is ground as necessary. The first magnetic sheet 1101 may be formed by printing, sputtering, or the like. Thereafter, an opening 1101a is formed at a predetermined position of the first magnetic sheet 1101 by using a laser. The predetermined position is a position corresponding to a connection portion between the first connection wiring 51 and the first via wiring 121v and a connection portion between the second connection wiring 52 and the second via wiring 122v. The opening 1101a may be formed by photolithography, an etching method, or the like.

Figure 8F:
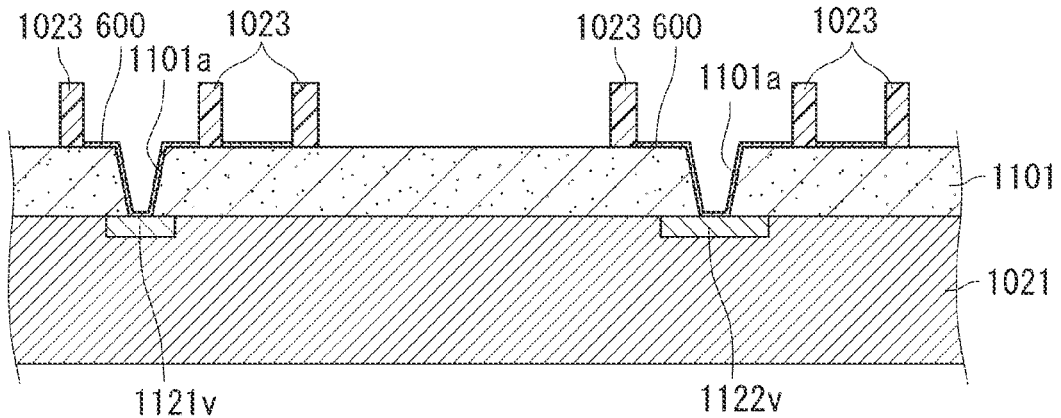
FIG. 8F is a schematic cross-sectional view illustrating the method for manufacturing the passive component.

As illustrated in FIG. 8F, a seed layer is formed on the upper surface of the first magnetic sheet 1101 and the inner surface of the opening 1101a using a sputtering method. Thereafter, a resist layer (not illustrated) is applied, and a cavity having a predetermined pattern is formed in the resist layer by a photolithography process. The seed layer is then etched to form a patterned seed layer 600. The seed layer 600 is formed at a predetermined position on the upper surface of the first magnetic sheet 1101 and on the inner surface of the opening 1101a. The predetermined position is a position at which the coil 110A is provided. Thereafter, a photosensitive permanent film is applied, and an organic insulating layer 1023 corresponding to the organic insulating portion 23 is formed by a photolithography process.

Here, when the above seed layer is etched, the resin or the magnetic powder on the upper surface of the first magnetic sheet 1101 may be intentionally dissolved by the etching liquid. Accordingly, it is possible to form a boundary portion with a small amount of magnetic powder between the first magnetic sheet 1101 and the wiring layer, between the first magnetic sheet 1101 and a second magnetic sheet 1102 to be described later, or the like. An air gap can be formed by the boundary portion, and DC superposition characteristics can be improved. The boundary portion is preferably formed at least in a contact portion between the first magnetic layer 101 and the second magnetic layer 102 in FIG. 6, for example.

Figure 8G:
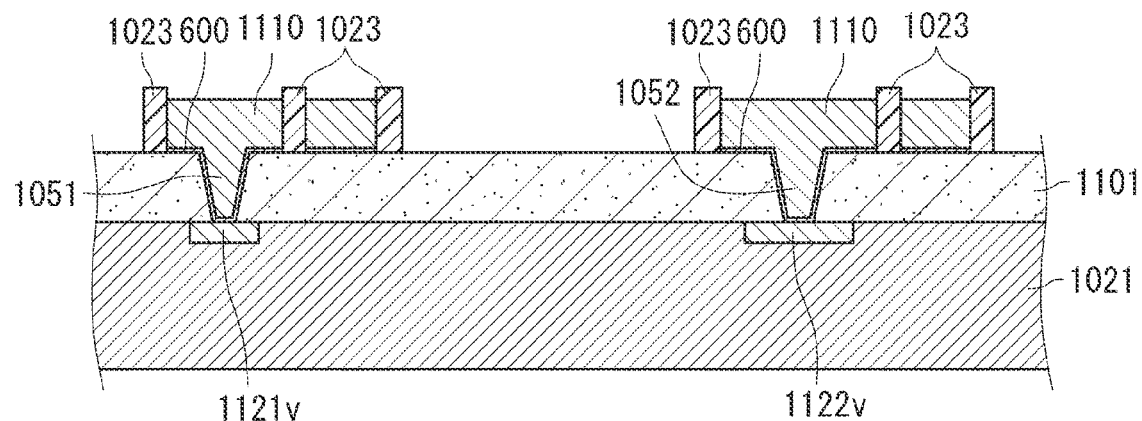
FIG. 8G is a schematic cross-sectional view illustrating the method for manufacturing the passive component.

As illustrated in FIG. 8G, a first connection wiring conductor layer 1051 corresponding to the first connection wiring 51, a second connection wiring conductor layer 1052 corresponding to the second connection wiring 52, and a coil conductor layer 1110 corresponding to the coil 110A are formed on the upper surface of the seed layer 600 by electrolytic plating. The conductive material of the first connection wiring conductor layer 1051, the second connection wiring conductor layer 1052, and the coil conductor layer 1110 is, for example, Cu. Here, as in the etching of the above seed layer, a boundary portion having a small amount of magnetic powder may be formed between the first magnetic sheet 1101 and the wiring layer, between the first magnetic sheet 1101 and the second magnetic sheet 1102, or the like by the above electrolytic plating.

Figure 8H:
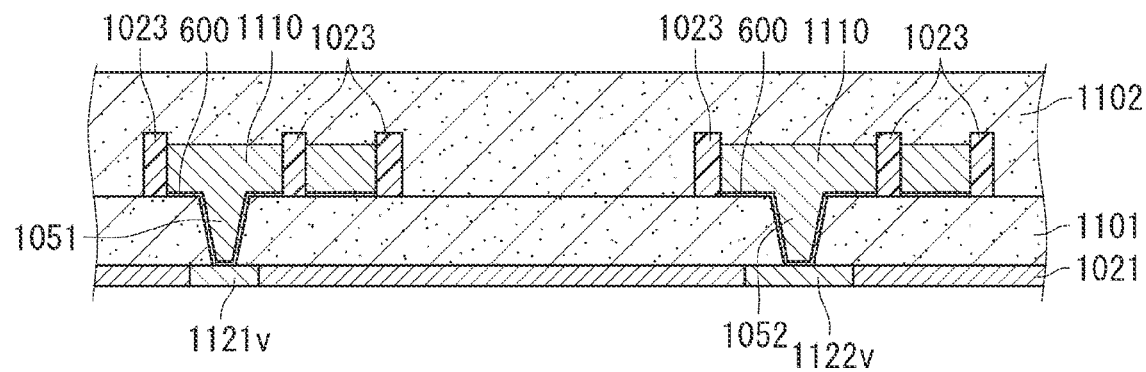
FIG. 8H is a schematic cross-sectional view illustrating the method for manufacturing the passive component.

As illustrated in FIG. 8H, the second magnetic sheet 1102 corresponding to the second magnetic layer 102 is performed thermocompression bonding so as to cover the coil conductor layer 1110 and the organic insulating portion 23. Thereafter, the second magnetic sheet 1102 is ground as necessary. Thereafter, the inorganic substrate 1021 is polished to expose the end surface of the first via conductor layer 1121v and the end surface of the second via conductor layer 1122v. CMP is preferred for polishing the inorganic substrate 1021.

Figure 8I:
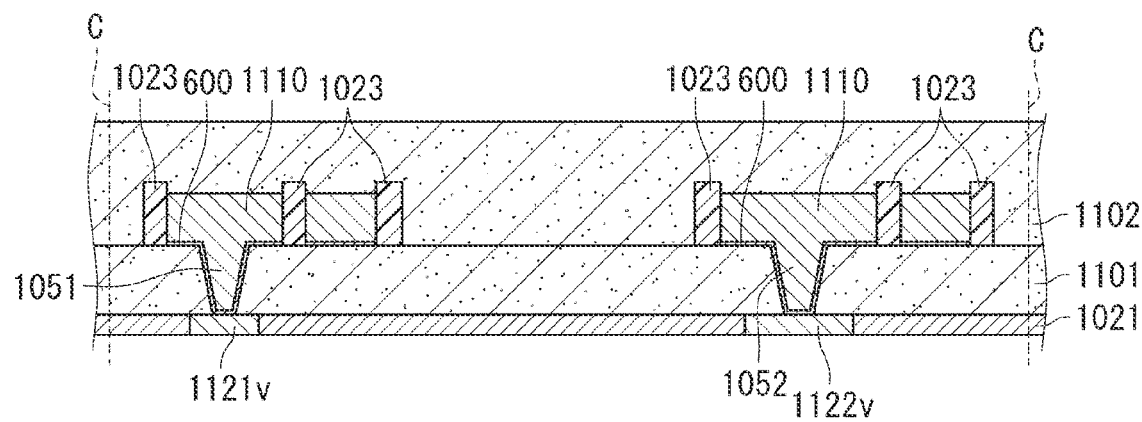
FIG. 8I is a schematic cross-sectional view illustrating the method for manufacturing the passive component.

As illustrated in FIG. 8I, singulation is performed along the cut line C. Thus, as illustrated in FIG. 6, the passive component 1A is manufactured.

Third Embodiment

Configuration of Passive Component 1B

Figure 9:
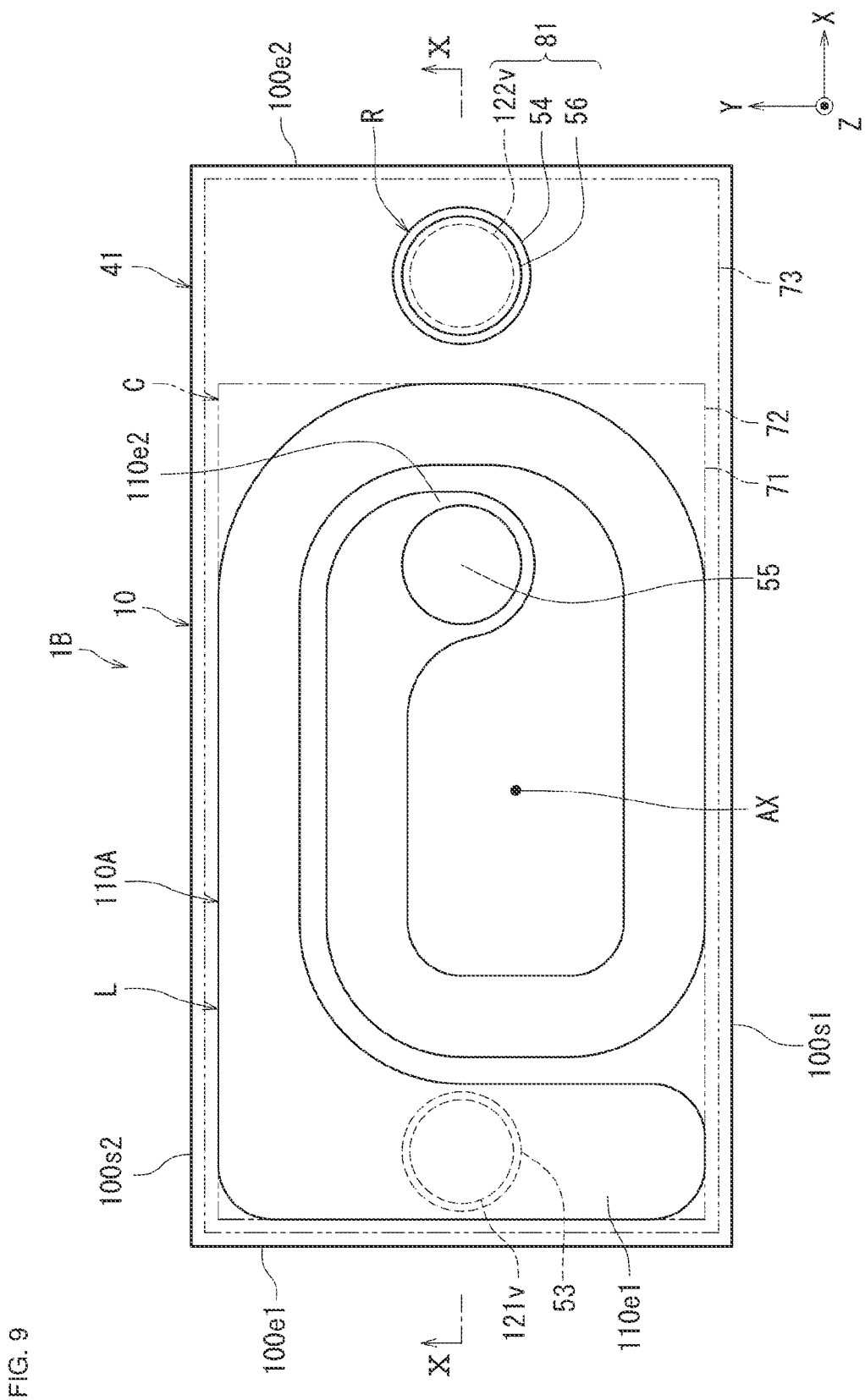
FIG. 9 is a schematic top view illustrating a third embodiment of a passive component viewed from a top surface side.
Figure 10:
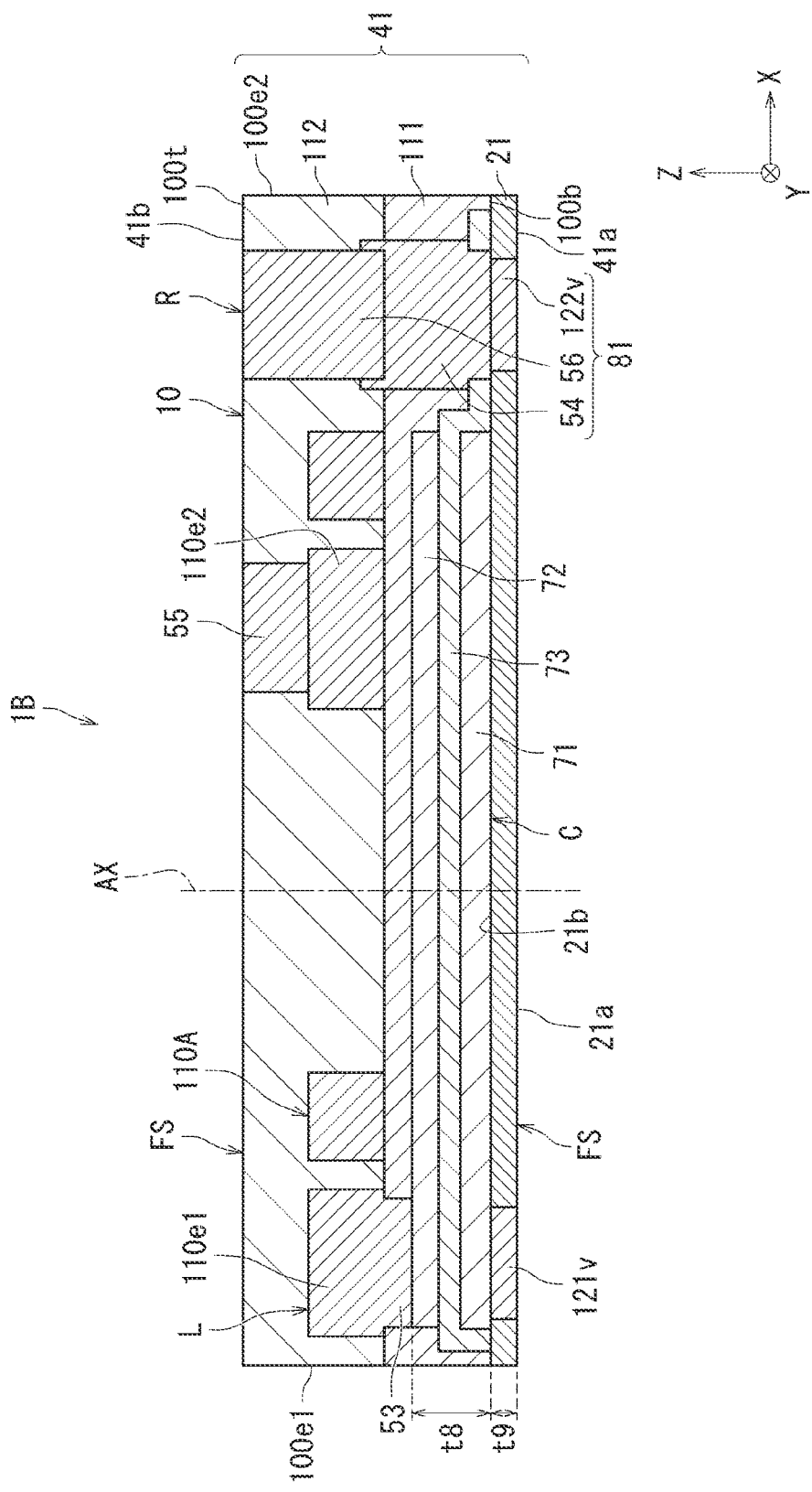
FIG. 10 is a cross-sectional view taken along a line X-X of FIG. 9.

FIG. 9 is a schematic top view illustrating a third embodiment of the passive component viewed from the top surface side. FIG. 10 is a cross-sectional view taken along a line X-X of FIG. 9. The third embodiment is different from the second embodiment mainly in the configuration of the element body, in that the capacitor element and the resistor element are further provided, and in that the second main surface of the body portion is a flat surface. This different configuration will be described below. The other configurations are the same as those of the second embodiment, and are denoted by the same reference signs as those of the second embodiment, and description thereof is omitted.

A passive component 1B is an electronic component including passive elements such as the inductor element L, a capacitor element C, and a resistor element R. The inductor element L and the capacitor element C are electrically connected in series to each other. The resistor element R is electrically independent from the inductor element L and the capacitor element C. As illustrated in FIG. 9 and FIG. 10, when viewed from the Z direction, the inductor element L and the capacitor element C are arranged on the first end surface 100e1 side with respect to the center of the element body 10, and the resistor element R is arranged on the second end surface 100e2 side with respect to the center of the element body 10.

The body portion 41 includes the element body 10 and the inorganic layer 21 provided on the bottom surface 100b of the element body 10. The element body 10 includes a first insulating layer 111 provided on the second main surface 21b of the inorganic layer, the capacitor element C, a third connection wiring 53, and a fourth connection wiring 54 provided inside the first insulating layer 111, a second insulating layer 112 provided on the first insulating layer 111, and the inductor element L, a fifth connection wiring 55, and a sixth connection wiring 56 provided inside the second insulating layer 112.

The first insulating layer 111 electrically insulates the capacitor element C and the resistor element R from each other. The material of the first insulating layer 111 is not particularly limited, but is, for example, $SiO_2$. The capacitor element C includes a first capacitor electrode 71 and a second capacitor electrode 72 opposed to each other in the Z direction, and a dielectric layer 73 arranged between the first capacitor electrode 71 and the second capacitor electrode 72. The first capacitor electrode 71 is provided on the second main surface 21b of the inorganic layer 21 so as to cover the first via wiring 121v, and is connected to the first via wiring 121v. The dielectric layer 73 is provided so as to cover the first capacitor electrode 71. An end portion of the dielectric layer 73 on the forward X direction side extends to the vicinity of the second end surface 100e2 of the element body 10. The second capacitor electrode 72 is provided on the dielectric layer 73. The second capacitor electrode 72 is arranged so as to overlap the first capacitor electrode 71 when viewed from the Z direction.

The conductive material of the first capacitor electrode 71 and the second capacitor electrode 72 is not particularly limited and is, for example, Al. Preferably, the conductive material of the first and second capacitor electrodes 71 and 72 is different from the conductive material of each of the first and second via wirings 121v and 122v and the coil 110A. Thus, by using different conductive materials for the first and second capacitor electrodes 71 and 72 through which no direct current flows and the first and second via wirings 121v and 122v and the coil 110A through which a direct current flows, it is possible to reduce the manufacturing cost without deteriorating the characteristics of the passive component 1B. More specifically, since Al has low electrical conductivity but is inexpensive, it is preferable to use Al for the first and second capacitor electrodes 71 and 72 of the capacitor element C which is a voltage element. In addition, Cu having high electrical conductivity is preferably used for the coil 110A of the inductor element L which is a current element, and the first and second via wirings 121v and 122v. Thus, the manufacturing cost can be reduced without deteriorating the characteristics of the passive component 1B.

The material of the dielectric layer 73 is not particularly limited and is, for example, $SiO_2$. The material of the dielectric layer 73 may be, for example, a high-k material such as $HfO_2$ or $Y_2O_3$. Thus, the capacitance of the capacitor element C can be increased. Preferably, the material of the dielectric layer 73 is the same as the material of the second insulating layer 112. Accordingly, since the material of the dielectric layer 73 is the same as the material of the second insulating layer 112 that covers at least the coil 110A, the manufacturing cost of the passive component 1B can be reduced. In addition, it is possible to reduce residual stresses that may occur in the passive component 1B.

The second insulating layer 112 electrically insulates the inductor element L and the resistor element R from each other. The material of the second insulating layer 112 is an insulating inorganic substance, such as $SiO_2$. The second insulating layer 112 may be made of a magnetic material.

The third connection wiring 53 penetrates the first insulating layer 111 in the Z direction and connects the second capacitor electrode 72 and the outer peripheral end 110e1 of the coil 110A. The fourth connection wiring 54 passes through the first insulating layer 111 and the dielectric layer 73 in the Z direction and connects the second via wiring 122v and the sixth connection wiring 56. The fifth connection wiring 55 penetrates the second insulating layer 112 in the Z direction. The end surface on the reverse Z direction side of the fifth connection wiring 55 is connected to the inner peripheral end 110e2 of the coil 110A, and the end surface on the forward Z direction side of the fifth connection wiring 55 is exposed from the upper surface of the second insulating layer 112 (the top surface 100t of the element body 10). The coil 110A does not include the third connection wiring 53 and the fifth connection wiring 55. The sixth connection wiring 56 penetrates the second insulating layer 112 in the Z direction. The end surface of the sixth connection wiring 56 on the reverse Z direction side is connected to the upper surface of the fourth connection wiring 54, and the end surface of the sixth connection wiring 56 on the forward Z direction side is exposed from the upper surface of the second insulating layer 112.

The conductive material of the third connection wiring 53 and the fourth connection wiring 54 is not particularly limited, but is the same as the conductive material of the coil 110A, for example. The conductive material of the fifth connection wiring 55 and the sixth connection wiring 56 is a conductive inorganic substance.

By connecting the first via wiring 121v, the capacitor element C, the third connection wiring 53, the coil 110A, and the fifth connection wiring 55 in this order, the capacitor element C and the inductor element L are electrically connected in series.

The second via wiring 122v, the fourth connection wiring 54, and the sixth connection wiring 56 are connected in this order to form a conduction wiring 81. The conduction wiring 81 extends from the first main surface 41a to the second main surface 41b of the body portion 41, and both end portions thereof in the extending direction are exposed from the first main surface 41a and the second main surface 41b of the body portion 41. According to this configuration, since electric signals can be extracted from both the first main surface 41a and the second main surface 41b of the body portion 41 via the conduction wiring 81, electronic components and the like can be stacked on both the first main surface 41a side and the second main surface 41b side of the body portion 41. The conduction wiring 81 is electrically independent from the inductor element L and the capacitor element C. According to this configuration, an electric signal different from the electric signals of the inductor element L and the capacitor element C can be taken out through the conduction wiring 81. In this embodiment, the conduction wiring 81 serves as the resistor element R.

At least apart of the second main surface 41b of the body portion 41 is a flat surface FS made of an inorganic substance. In this embodiment, the entire second main surface 41b of the body portion 41 is the flat surface FS made of an inorganic substance. To be specific, the upper surface of the second insulating layer 112 (the top surface 100t of the element body 10), the exposed surface of the fifth connection wiring 55 from the upper surface of the second insulating layer 112, and the exposed surface of the sixth connection wiring 56 from the upper surface of the second insulating layer 112 are the flat surfaces FS made of an inorganic substance. According to this configuration, since at least a part of the second main surface 41b of the body portion 41 is the flat surface FS made of an inorganic substance, when the body portion 41 is bonded to another electronic component or the like having the flat surface FS, the flat surface FS of the second main surface 41b of the body portion 41 and the flat surface FS of the electronic component or the like can be bonded in a state of being in contact with each other. Therefore, it is possible to further reduce the thickness of the entire device such as a stacked semiconductor package.

Preferably, the passive component 1B includes one or more passive elements, the one or more passive elements are at least one of the inductor element L, the capacitor element C, and the resistor element R. According to this configuration, since at least one of the inductor element L, the capacitor element C, and the resistor element R can be included in the one passive component 1B, it is not necessary to prepare a plurality of passive components individually including the respective elements. Therefore, the entire device such as a stacked semiconductor package can be reduced in size.

Preferably, as illustrated in FIG. 10, a thickness t9 of the inorganic layer 21 in the direction orthogonal to the first main surface 41a of the body portion 41 is smaller than a thickness t8 of the capacitor element C in the direction orthogonal to the first main surface 41a of the body portion 41. According to this configuration, the passive component 1B can be made thinner.

Method for Manufacturing Passive Component 1B

Next, a method for manufacturing the passive component 1B will be described with reference to FIG. 11A to FIG. 11J. FIG. 11A to FIG. 11J are views corresponding to the X-X cross section of FIG. 9.

Figure 11A:
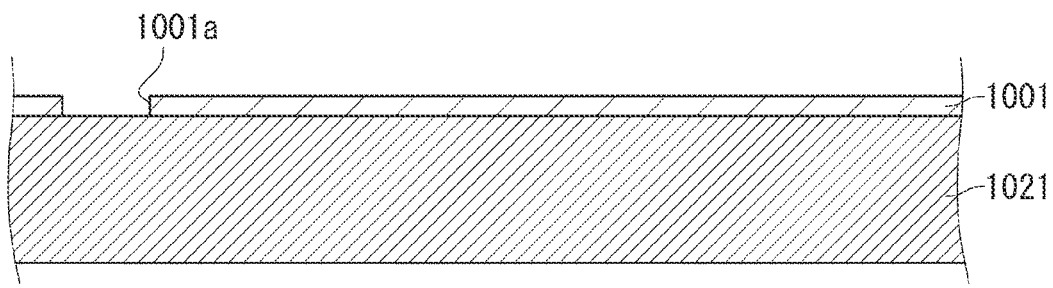
FIG. 11A is a schematic cross-sectional view illustrating a method for manufacturing a passive component.

As illustrated in FIG. 11A, the inorganic substrate 1021 corresponding to the inorganic layer 21 is prepared. The inorganic substrate 1021 is, for example, an Si substrate. The first resist layer 1001 is applied to the upper surface of the inorganic substrate 1021, and the cavity 1001a having a predetermined pattern is formed in the first resist layer 1001 by a photolithography process.

Figure 11B:
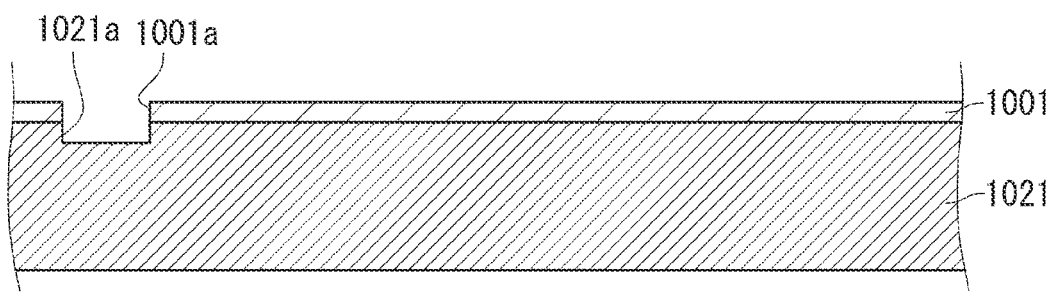
FIG. 11B is a schematic cross-sectional view illustrating the method for manufacturing the passive component.

As illustrated in FIG. 11B, the inorganic substrate 1021 is etched through the cavity 1001a to form the groove 1021a. The etching may be either dry etching or wet etching. In the present embodiment, since an Si substrate is used as the inorganic substrate 1021, plasma etching using a fluorine-based gas is used.

Figure 11C:
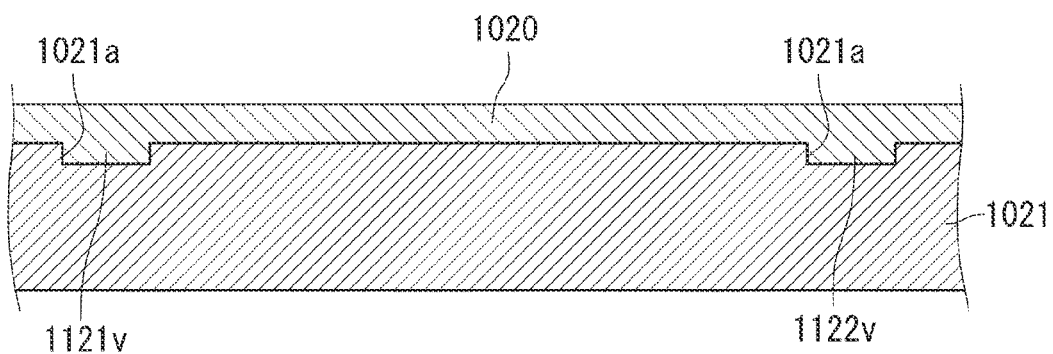
FIG. 11C is a schematic cross-sectional view illustrating the method for manufacturing the passive component.

As illustrated in FIG. 11C, the first resist layer 1001 is peeled off, a seed layer (not illustrated) is formed on the upper surface of the inorganic substrate 1021, and a conductive material of the first via wiring 121v and the second via wiring 122v is used to form a film (solid coating) on the upper surface of the seed layer by electrolytic plating so as to cover the groove 1021a. As a result, the first via conductor layer 1121v corresponding to the first via wiring 121v and the second via conductor layer 1122v corresponding to the second via wiring 122v are formed in the groove 1021a. Further, the solid film 1020 is formed on the upper surface of the inorganic substrate 1021. In the present embodiment, Ti/Cu is used for the seed layer, but a seed species such as W, TiW, or Ag and a combination thereof may be selected as necessary.

Figure 11D:
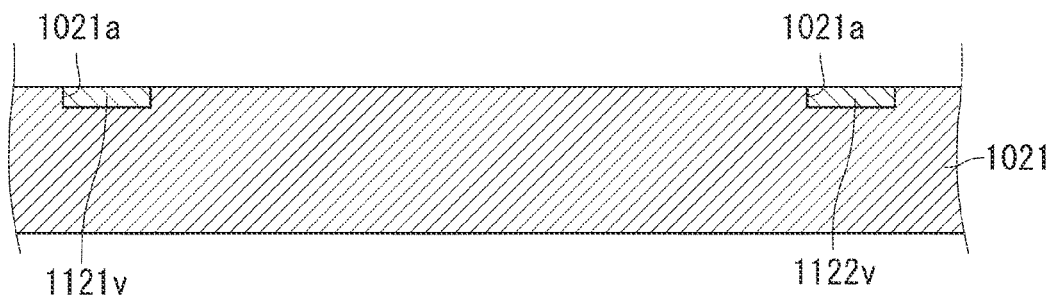
FIG. 11D is a schematic cross-sectional view illustrating the method for manufacturing the passive component.

As illustrated in FIG. 11D, the solid film 1020 is removed by etching. The solid film 1020 may be removed by CMP or polishing.

Figure 11E:
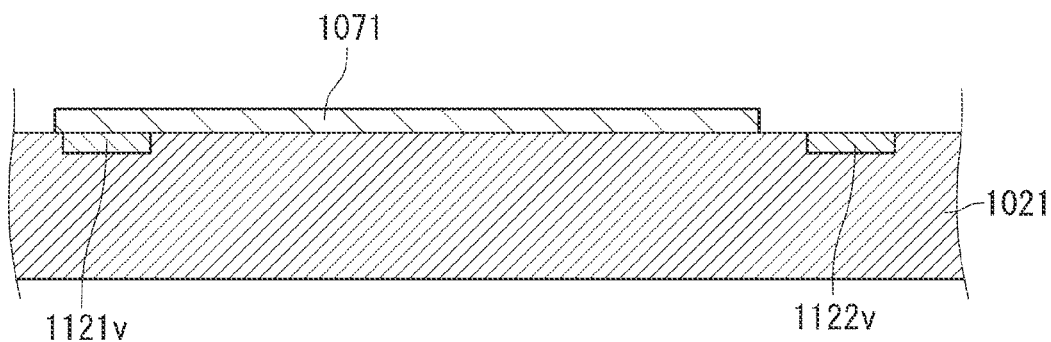
FIG. 11E is a schematic cross-sectional view illustrating the method for manufacturing the passive component.

As illustrated in FIG. 11E, a first capacitor-electrode conductor layer 1071 corresponding to the first capacitor electrode 71 is formed on the inorganic substrate 1021 so as to cover the first via conductor layer 1121v and the second via conductor layer 1122v. Specifically, an Al film, for example, is formed on the upper surface of the inorganic substrate 1021 by sputtering. Thereafter, a resist layer (not illustrated) is applied, and a cavity having a predetermined pattern is formed in the resist layer by a photolithography process. Thereafter, the Al film is etched to form a patterned first capacitor-electrode conductor layer 1071. Thereafter, the resist layer is peeled off.

Figure 11F:
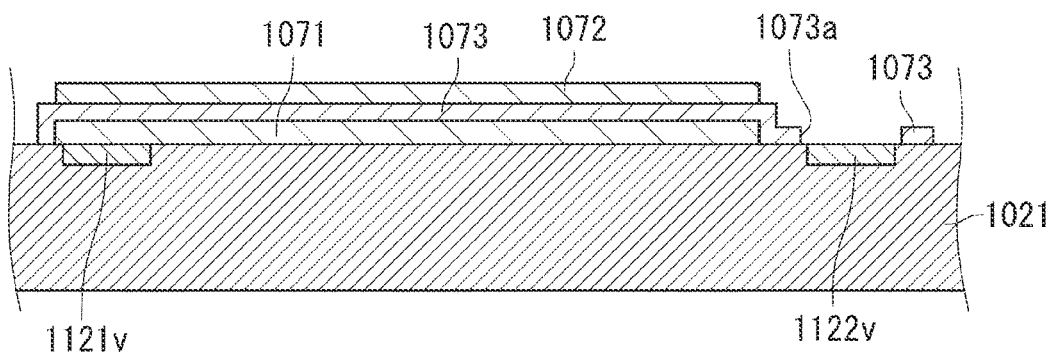
FIG. 11F is a schematic cross-sectional view illustrating the method for manufacturing the passive component.

As illustrated in FIG. 11F, a dielectric material layer 1073 corresponding to the dielectric layer 73 is formed on the inorganic substrate 1021 so as to cover the first capacitor-electrode conductor layer 1071, and a second capacitor-electrode conductor layer 1072 corresponding to the second capacitor electrode 72 is formed on the dielectric material layer 1073. The second capacitor-electrode conductor layer 1072 is formed so as to overlap the first capacitor-electrode conductor layer 1071 when viewed from the Z direction.

Specifically, a dielectric material layer is formed on the inorganic substrate 1021 so as to cover the first capacitor-electrode conductor layer 1071 using a vapor deposition method. The material of the dielectric material layer is for example $SiO_2$. Thereafter, a resist layer (not illustrated) is applied, and a cavity having a predetermined pattern is formed in the resist layer by a photolithography process. The dielectric material layer is then etched to form a patterned dielectric material layer 1073. At this time, an opening 1073a is formed in the dielectric material layer 1073 so that the upper surface of the second via conductor layer 1122v is exposed. Thereafter, the resist layer is peeled off. Thereafter, an Al film, for example, is formed on the upper surface of the dielectric material layer 1073 and the upper surface of the inorganic substrate 1021 by sputtering. Thereafter, a resist layer (not illustrated) is applied, and a cavity having a predetermined pattern is formed in the resist layer by a photolithography process. Thereafter, the Al film is etched to form the patterned second capacitor-electrode conductor layer 1072. Thereafter, the resist layer is peeled off. Note that the dielectric material layer 1073 and the second capacitor-electrode conductor layer 1072 may be alternately stacked. Thus, the capacitance of the capacitor element C can be increased.

Figure 11G:
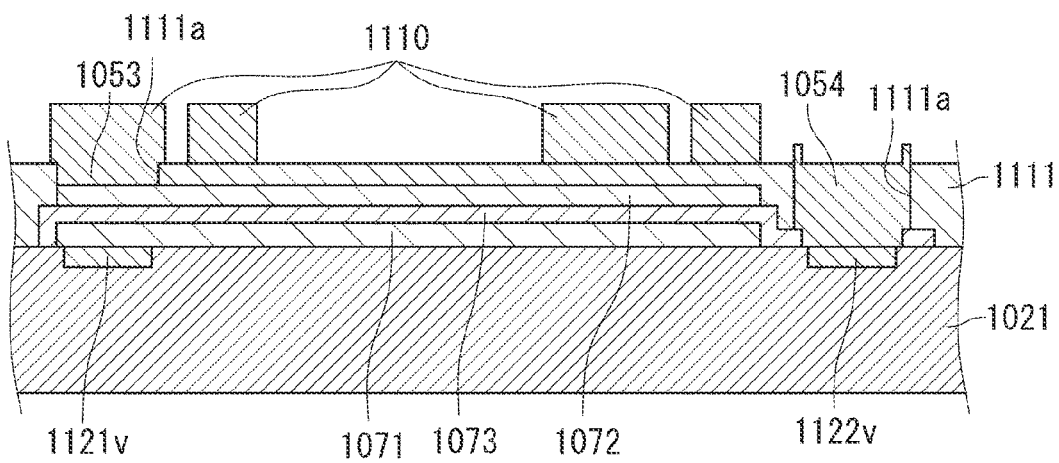
FIG. 11G is a schematic cross-sectional view illustrating the method for manufacturing the passive component.

As illustrated in FIG. 11G, a first insulating material layer 1111 corresponding to the first insulating layer 111 is formed so as to cover the second capacitor-electrode conductor layer 1072 and the dielectric material layer 1073. Specifically, the first insulating material layer is formed using a chemical vapor deposition (CVD) method so as to cover the second capacitor-electrode conductor layer 1072 and the dielectric material layer 1073. The material of the first insulating material layer is, for example, $SiO_2$. Thereafter, a resist layer (not illustrated) is applied, and a cavity having a predetermined pattern is formed in the resist layer by a photolithography process. Thereafter, the first insulating material layer is etched to form the patterned first insulating material layer 1111. At this time, an opening 1111a is formed at a position corresponding to the position where the third connection wiring 53 and the fourth connection wiring 54 are provided.

Thereafter, a third connection wiring conductor layer 1053 corresponding to the third connection wiring 53 and a fourth connection wiring conductor layer 1054 corresponding to the fourth connection wiring 54 are formed in the opening 1111a, and the coil conductor layer 1110 is formed on the upper surface of the third connection wiring conductor layer 1053 and on the first insulating material layer 1111. A semi-additive method may be used as a method of forming the third connection wiring conductor layer 1053, the fourth connection wiring conductor layer 1054, and the coil conductor layer 1110. Note that instead of the semi-additive method, a known method such as a subtractive method, a full-additive method, or a printing method of conductive paste may be used. In the present embodiment, Ti/Cu is used for the seed layer, but a seed species such as W, TiW, or Ag and a combination thereof may be selected as necessary.

Figure 11H:
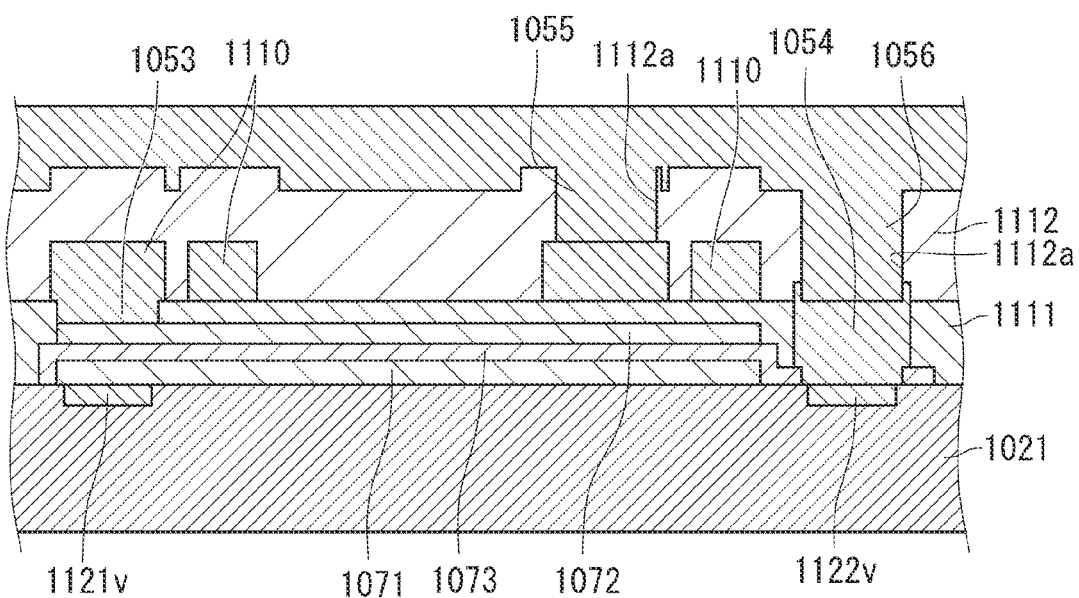
FIG. 11H is a schematic cross-sectional view illustrating the method for manufacturing the passive component.

As illustrated in FIG. 11H, a second insulating material layer 1112 corresponding to the second insulating layer 112 is formed so as to cover the coil conductor layer 1110. Specifically, the second insulating material layer is formed by the CVD method so as to cover the coil conductor layer 1110. Thereafter, a resist layer (not illustrated) is applied, and a cavity having a predetermined pattern is formed in the resist layer by a photolithography process. Thereafter, the second insulating material layer is etched to form the patterned second insulating material layer 1112. At this time, an opening 1112a is formed at a position corresponding to the position where the fifth connection wiring 55 and the sixth connection wiring 56 are provided.

Thereafter, a fifth connection wiring conductor layer 1055 corresponding to the fifth connection wiring 55 and a sixth connection wiring conductor layer 1056 corresponding to the sixth connection wiring 56 are formed in the opening 1112a. Specifically, the fifth connection wiring conductor layer 1055 and the sixth connection wiring conductor layer 1056 are formed by filling plating. At this time, plating is also formed on the second insulating material layer 1112. The conductive material of the fifth connection wiring conductor layer 1055 and the sixth connection wiring conductor layer 1056 is, for example, Cu.

Figure 11I:
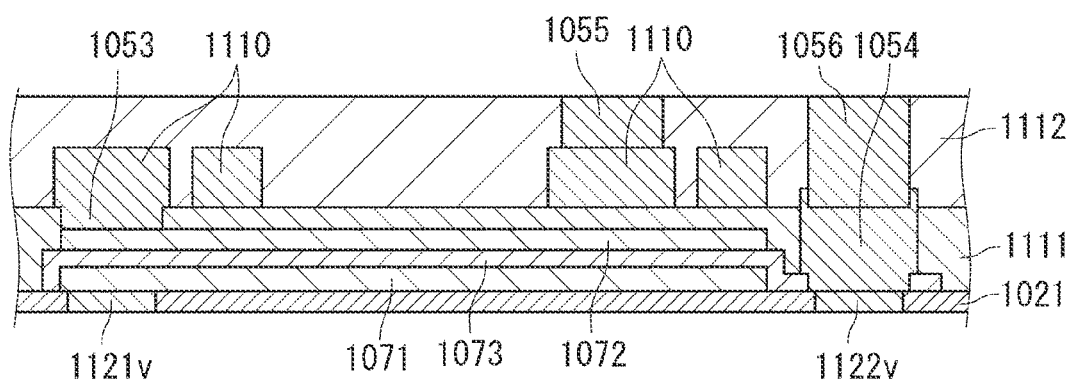
FIG. 11I is a schematic cross-sectional view illustrating the method for manufacturing the passive component.

As illustrated in FIG. 11I, the plating on the second insulating material layer 1112, the fifth connection wiring conductor layer 1055, and the sixth connection wiring conductor layer 1056 are polished to expose the second insulating material layer 1112, the end surface of the fifth connection wiring conductor layer 1055, and the end surface of the sixth connection wiring conductor layer 1056. As a result, the upper surface of the second insulating material layer 1112, the end surface of the fifth connection wiring conductor layer 1055, and the end surface of the sixth connection wiring conductor layer 1056 are planarized. CMP is preferred for the above polishing. Thereafter, the inorganic substrate 1021 is polished to expose the end surface of the first via conductor layer 1121v and the end surface of the second via conductor layer 1122v. As a result, the lower surface of the inorganic substrate 1021, the end surface of the first via conductor layer 1121v, and the end surface of the second via conductor layer are planarized. CMP is preferred for polishing the inorganic substrate 1021.

Figure 11J:
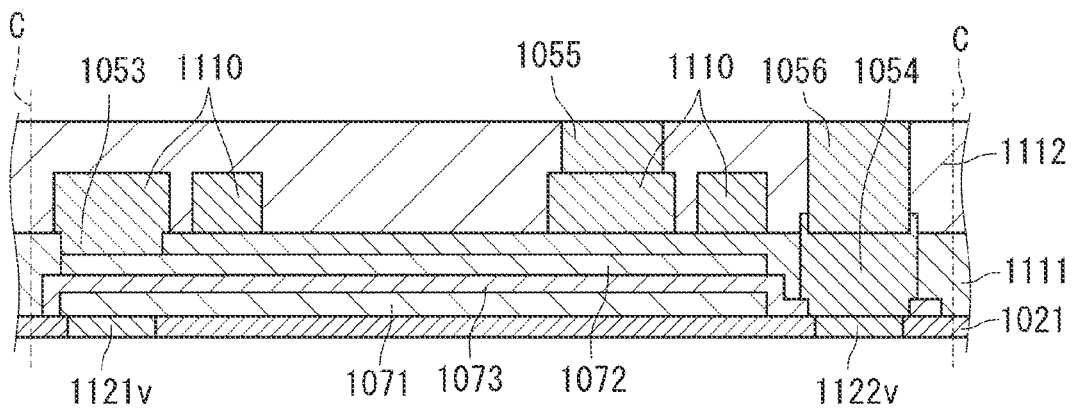
FIG. 11J is a schematic cross-sectional view illustrating the method for manufacturing the passive component.

As illustrated in FIG. 11J, singulation is performed along the cut line C. Thus, as illustrated in FIG. 10, the passive component 1B is manufactured.

Fourth Embodiment

Configuration of Stacked Semiconductor Package 7

Figure 12:
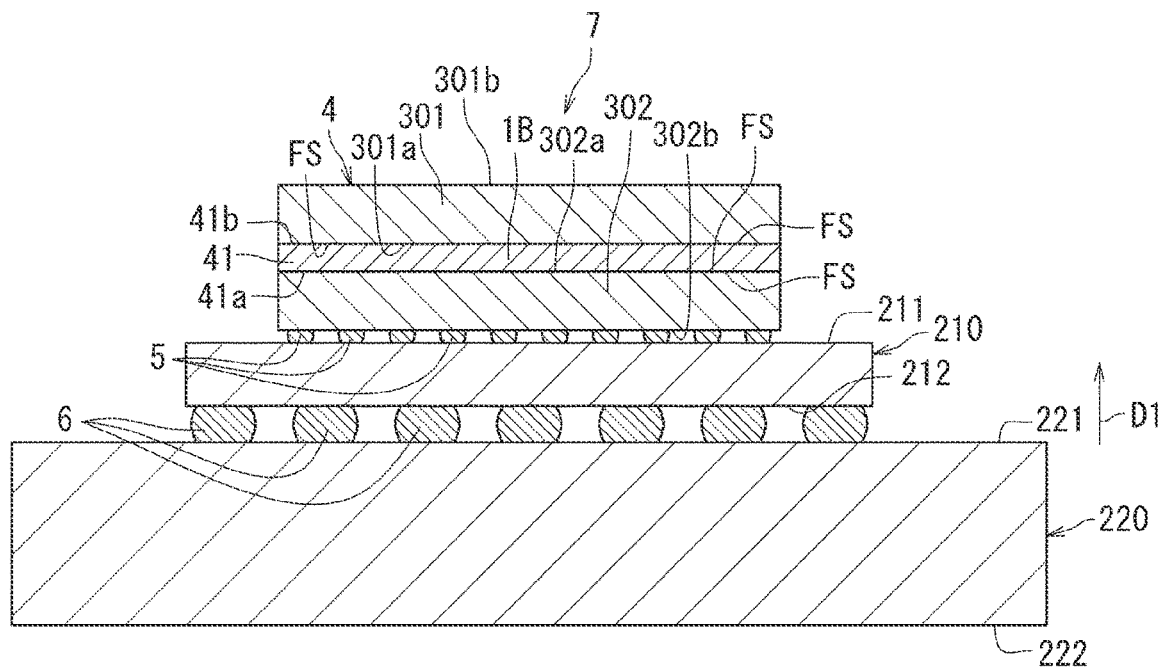
FIG. 12 is a schematic cross-sectional view illustrating a stacked semiconductor package.

FIG. 12 is a schematic cross-sectional view illustrating a stacked semiconductor package 7. As illustrated in FIG. 12, the stacked semiconductor package 7 includes a second substrate 220, a first substrate 210 stacked on the second substrate 220 in a first direction D1, and a three-dimensional device 4 stacked on the first substrate 210 in the first direction D1. The first direction D1 is an upward direction in the drawing.

The first substrate 210 is, for example, an inorganic substrate made of Si or $SiO_2$ (so-called silicon interposer substrate or glass interposer substrate), or an organic substrate made of Flame Retardant Type 4 (FR4), epoxy, polyimide, or the like (so-called organic package substrate). Wiring is provided inside or on the main surface of the first substrate 210 and is electrically connected to the three-dimensional device 4. A conductive member such as an external terminal, a conductor bump, a conductor pillar, or solder may be provided on the main surface of the first substrate 210. A similar conductive member may also be provided on the main surface of the three-dimensional device 4 facing the first substrate 210.

Similar to the first substrate 210, the second substrate 220 is, for example, an inorganic substrate made of Si or $SiO_2$, or an organic substrate made of FR4, epoxy, polyimide, or the like. The design accuracy of the second substrate 220 is lower than that of the first substrate 210. Wiring is provided inside or on the main surface of the second substrate 220, and is electrically connected to the first substrate 210. A conductive member such as an external terminal, a conductor bump, a conductor pillar, or solder may be provided on the main surface of the second substrate 220. A similar conductive member may be provided on the main surface of the first substrate 210 facing the second substrate 220.

The three-dimensional device 4 includes the passive component 1B having the flat surface FS made of an inorganic substance, and a first semiconductor integrated circuit component 301 and a second semiconductor integrated circuit component 302 bonded to the flat surface FS. The passive component 1B is the same as the passive component 1B described in the third embodiment. The first semiconductor integrated circuit component 301 and the second semiconductor integrated circuit component 302 are, for example, electronic components such as an integrated circuit (IC), a central processing unit (CPU), a power management IC (PMIC), a memory, and a transistor.

A first main surface 301a of the first semiconductor integrated circuit component 301 facing the passive component 1B includes the flat surface FS. The second main surface 41b of the body portion 41 of the passive component 1B facing the first semiconductor integrated circuit component 301 includes the flat surface FS. The flat surface FS of the first semiconductor integrated circuit component 301 and the flat surface FS of the second main surface 41b of the passive component 1B are bonded in contact with each other. Similarly, a first main surface 302a of the second semiconductor integrated circuit component 302 facing the passive component 1B includes the flat surface FS. The first main surface 41a of the body portion 41 of the passive component 1B facing the second semiconductor integrated circuit component 302 includes the flat surface FS. The flat surface FS of the second semiconductor integrated circuit component 302 and the flat surface FS of the first main surface 41a of the passive component 1B are bonded in contact with each other. According to this configuration, the thin-type three-dimensional device 4 can be obtained.

Note that when the flat surface FS of the semiconductor integrated circuit component and the flat surface FS of the passive component cannot be separated from each other, the surface roughness of the flat surface FS may be calculated from the cross section of the three-dimensional device. Specifically, a cross section of the bonding portion of the flat surface FS is exposed by a known method such as ion milling, and an image of the bonding portion is acquired by a transmission electron microscope (TEM) or the like. At this time, the magnification is preferably equal to or more than 300 K. The interface of the bonding portion of the flat surface FS can be recognized from the difference of the grain boundary or the like. Using the acquired image, a straight line (a line drawn by the least squares method) is drawn at a position corresponding to the interface. The surface roughness can be determined by measuring Ra (arithmetic average roughness) with respect to this straight line.

The three-dimensional device 4 is not limited to the configuration illustrated in FIG. 12, and the number of passive components may be two or more, and the number of semiconductor integrated circuit components may be one or three or more. Further, the stacking order of the semiconductor integrated circuit component and the passive component in the first direction D1 is not particularly limited.

A first main surface 211 of the first substrate 210 facing the three-dimensional device 4 and a first main surface (a second main surface 302b of the second semiconductor integrated circuit component 302) of the three-dimensional device 4 facing the first substrate 210 are connected with a connection member 5 interposed therebetween in a state of being separated from each other. A first main surface 221 of the second substrate 220 facing the first substrate 210 and a second main surface 212 of the first substrate 210 facing the second substrate 220 are connected to each other with a connection member 6 interposed therebetween in a state of being separated from each other. The connection members 5 and 6 are, for example, solder, a conductor bump, a conductor pillar, or the like.

Modification

Figure 13:
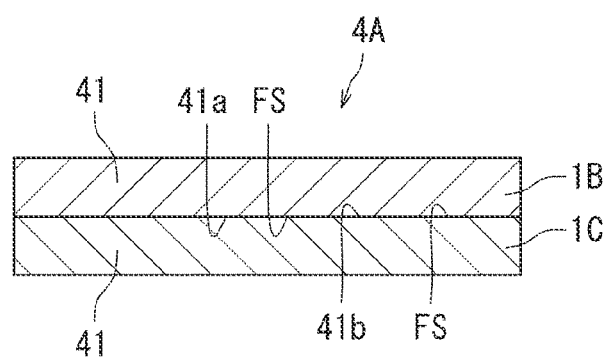
FIG. 13 is a schematic cross-sectional view illustrating a modification of a three-dimensional device.

FIG. 13 is a schematic cross-sectional view illustrating a three-dimensional device 4A according to a modification. As illustrated in FIG. 13, the three-dimensional device 4A consists of only passive components. The three-dimensional device 4A includes the passive component 1B having the flat surface FS made of an inorganic substance and a passive component 1C bonded to the flat surface FS. The passive component 1B and the passive component 1C are stacked. The passive component 1B is the same as the passive component 1B described in the third embodiment. The passive component 1C is different from the passive component 1B described in the third embodiment in the position of the exposed surface of the fifth connection wiring 55 from the second main surface 41b of the body portion 41. To be specific, in the passive component 1C, the fifth connection wiring 55 is exposed from the second main surface 41b of the body portion 41 at a position corresponding to the first via wiring 121v of the stacked passive component 1B. The flat surface FS of the second main surface 41b of the passive component 1C and the flat surface FS of the first main surface 41a of the passive component 1B are bonded to each other in a contact state. Therefore, the thickness of the three-dimensional device 4A can be reduced. Note that the passive components included in the three-dimensional device 4A are not limited to the passive component 1B and the passive component 1C, and may be other passive components having a flat surface. Further, the three-dimensional device 4A may include three or more passive components.

Note that the present disclosure is not limited to the above-described embodiments, and design changes can be made without departing from the gist of the present disclosure. For example, the features of the first to fourth embodiments may be combined in various ways.

Although the entire first main surface of the inorganic layer and the entire exposed surfaces of the first via wiring and the second via wiring from the first main surface of the inorganic layer are flat surfaces in the first to fourth embodiments, at least only a part of the first main surface of the inorganic layer may be a flat surface, at least only a part of the exposed surface may be a flat surface, or only a part of the first main surface of the inorganic layer and only a part of the exposed surface may be flat surfaces.

In the second embodiment, the coil has a planar spiral shape formed of one layer, but may have a plurality of layers of coil wiring in a planar spiral shape. Thus, the inductance can be improved.

In the fourth embodiment, the passive component of the three-dimensional device is the passive component of the third embodiment, but the type of the passive component is not particularly limited.

<1> A passive component comprising a body portion having a first main surface; and a passive element at least a part of which is provided inside the body portion. The first main surface at least partially includes a flat surface made of an inorganic substance and having a surface roughness of equal to or less than 1/1000 of a thickness of the body portion in a direction orthogonal to the first main surface or equal to or less than 10 nm.

<2> The passive component according to <1>, wherein the body portion includes an inorganic layer made of an inorganic substance and having a first main surface and a second main surface facing each other, and a through-wiring penetrating the inorganic layer from the first main surface to the second main surface of the inorganic layer. Also, the first main surface of the inorganic layer and an exposed surface of the through-wiring exposed from the first main surface of the inorganic layer constitute the first main surface of the body portion.

<3> The passive component according to <2>, wherein the through-wiring is made of an inorganic substance, and the exposed surface of the through-wiring constitutes at least a part of the flat surface.

<4> The passive component according to <2> or <3>, wherein the inorganic layer is amorphous or single crystal.

<5> The passive component according to any one of <1> to <4>, wherein the passive element includes a coil, and the coil has a central axis parallel to the first main surface of the body portion.

<6> The passive component according to any one of <1> to <5>, wherein the body portion includes an inorganic layer made of an inorganic substance and having a first main surface and a second main surface facing each other, and an organic insulating layer provided on the second main surface of the inorganic layer. Also, the first main surface of the inorganic layer constitutes at least a part of the first main surface of the body portion, the passive element includes a coil at least a part of which is provided inside the organic insulating layer, and the coil is in contact with both the inorganic layer and the organic insulating layer.

<7> The passive component according to any one of <1> to <6>, wherein the body portion includes an inorganic layer having a first main surface and a second main surface facing each other, the first main surface of the inorganic layer constitutes at least a part of the first main surface of the body portion, and a thickness of the inorganic layer in a direction orthogonal to the first main surface of the body portion is smaller than a thickness of the passive element in a direction orthogonal to the first main surface of the body portion.

<8> The passive component according to any one of <1> to <7>, wherein the body portion includes an inorganic layer having a first main surface and a second main surface facing each other. Also, the first main surface of the inorganic layer constitutes at least a part of the first main surface of the body portion, the passive element includes a coil having a central axis parallel to the first main surface of the body portion, and a thickness of the inorganic layer in a direction orthogonal to the first main surface of the body portion is smaller than a thickness of the coil in a direction orthogonal to the first main surface of the body portion.

<9> The passive component according to any one of <1> to <8>, wherein the body portion has a second main surface facing the first main surface. Also, an insulator provided on the second main surface of the body portion and made of an organic insulating resin is further provided, at least a part of the passive element is exposed from the second main surface of the body portion, and an exposed portion of the passive element exposed from the second main surface of the body portion is covered with the insulator.

<10> The passive component according to any one of <1> to <4>, wherein the passive element includes a coil, and the coil has a central axis orthogonal to the first main surface of the body portion.

<11> The passive component according to any one of <1> to <4>, wherein the body portion includes an inorganic layer having a first main surface and a second main surface facing each other, and a magnetic portion provided on the second main surface of the inorganic layer. Also, the first main surface of the inorganic layer constitutes at least a part of the first main surface of the body portion, the passive element includes a coil, and the coil is covered with the magnetic portion.

<12> The passive component according to <11>, wherein the coil is wound along a plane parallel to the first main surface. Also, the body portion further includes an organic insulating portion provided at least on a side surface of the coil orthogonal to the first main surface of the body portion, the magnetic portion covers the coil and the organic insulating portion, and the coil is in contact with the organic insulating portion and the magnetic portion.

<13> The passive component according to <12>, wherein a thickness of the organic insulating portion in a direction orthogonal to the first main surface of the body portion is thicker than a thickness of the coil in a direction orthogonal to the first main surface of the body portion.

<14> The passive component according to any one of <1> to <4>, wherein the body portion further includes a second main surface facing the first main surface, and the second main surface at least partially includes a flat surface made of an inorganic substance.

<15> The passive component according to <14>, wherein the at least one passive element includes at least one of an inductor element, a capacitor element, and a resistor element.

<16> The passive component according to <15>, wherein the at least one passive element includes at least an inductor element and a capacitor element. Also, the body portion further includes a conduction wiring extending from the first main surface to the second main surface of the body portion and having both end portions in the extending direction exposed from the first main surface and the second main surface of the body portion, and the conduction wiring is electrically independent from the inductor element and the capacitor element.

<17> The passive component according to <15> or <16>, wherein the body portion includes an inorganic layer having a first main surface and a second main surface facing each other, and a through-wiring penetrating the inorganic layer from the first main surface to the second main surface of the inorganic layer. Also, the first main surface of the inorganic layer constitutes at least a part of the first main surface of the body portion, the at least one passive element includes at least an inductor element and a capacitor element, the inductor element includes a coil, and the capacitor element includes two capacitor electrodes facing each other and a dielectric layer arranged between the two capacitor electrodes. In addition, a conductive material of the two capacitor electrodes is different from a conductive material of each of the through-wiring and the coil, the body portion includes an insulating layer covering at least the coil, and a material of the dielectric layer is the same as a material of the insulating layer.

<18> A three-dimensional device comprising the passive component according to any one of <1> to <17>; and a semiconductor integrated circuit component bonded to the flat surface of the passive component.

<19> A three-dimensional device comprising the passive component according to any one of <1> to <17>; and a passive component bonded to the flat surface of the passive component.

<20> A method for manufacturing a passive component comprising preparing an inorganic layer made of an inorganic substance and having a first main surface and a second main surface facing each other; forming a body portion including the inorganic layer and at least a part of a passive element by providing the passive element on the second main surface side of the inorganic layer; and providing a flat surface having a surface roughness of equal to or less than $\frac{1}{1000}$ of a thickness of the body portion in a direction orthogonal to the first main surface or equal to or less than 10 nm by polishing the first main surface of the inorganic layer.

What is claimed is:

1. A passive component comprising:
    a body portion having a first main surface; and
    at least one passive element at least a part of which is inside the body portion, wherein
    the first main surface at least partially includes a flat surface including an inorganic substance and having a surface roughness of equal to or less than $\frac{1}{1000}$ of a thickness of the body portion in a direction orthogonal to the first main surface or equal to or less than 10 nm,
    the body portion includes an inorganic layer including an inorganic substance and having a first main surface and a second main surface facing each other, and an insulating element body on the second main surface of the inorganic layer,
    the body portion has a second main surface facing the first main surface of the body portion, the second main surface of the body portion being configured by a surface of the element body, the body portion has a conductive through-wiring penetrating the inorganic layer from the first main surface to the second main surface of the inorganic layer and extending through the element body to the second main surface of the body portion, the first main surface of the inorganic layer and an exposed surface of the through-wiring exposed from the first main surface of the inorganic layer configure the first main surface of the body portion, and the conductive through-wiring is part of the at least one passive element.

2. The passive component according to claim 1, wherein the through-wiring includes an inorganic substance, and the exposed surface of the through-wiring configures at least a part of the flat surface.

3. The passive component according to claim 1, wherein the inorganic layer is amorphous or single crystal.

4. The passive component according to claim 1, wherein the passive element includes a coil, and the coil has a central axis parallel to the first main surface of the body portion.

5. The passive component according to claim 1, wherein the element body comprises, the passive element includes a coil at least a part of which is inside the organic insulating layer, and the coil is in contact with both the inorganic layer and the organic insulating layer.

6. The passive component according to claim 1, wherein a thickness of the inorganic layer in a direction orthogonal to the first main surface of the body portion is smaller than a thickness of the passive element in a direction orthogonal to the first main surface of the body portion.

7. The passive component according to claim 1, wherein the passive element includes a coil having a central axis parallel to the first main surface of the body portion, and a thickness of the inorganic layer in a direction orthogonal to the first main surface of the body portion is smaller than a thickness of the coil in a direction orthogonal to the first main surface of the body portion.

8. The passive component according to claim 1, wherein the passive component further includes an insulator on the second main surface of the body portion and including an organic insulating resin, at least a part of the passive element is exposed from the second main surface of the body portion, and an exposed portion of the passive element exposed from the second main surface of the body portion is covered with the insulator.

9. The passive component according to claim 1, wherein the passive element includes a coil, and the coil has a central axis orthogonal to the first main surface of the body portion.

10. The passive component according to claim 1, wherein the second main surface at least partially includes a flat surface including an inorganic substance.

11. The passive component according to claim 10, wherein the at least one passive element includes at least one of an inductor element, a capacitor element, and a resistor element.

12. The passive component according to claim 11, wherein the at least one passive element includes at least an inductor element and a capacitor element, the body portion further includes a conduction wiring extending from the first main surface of the body portion toward the second main surface and exposed from each of the first main surface and the second main surface of the body portion, and the conduction wiring is electrically independent from the inductor element and the capacitor element.

13. A three-dimensional device comprising:
the passive component according to claim 1; and
a semiconductor integrated circuit component bonded to the flat surface of the passive component.

14. A three-dimensional device comprising:
the passive component according to claim 1; and
a passive component bonded to the flat surface of the passive component.

15. The passive component of claim 1, wherein the inorganic layer of the body portion is a different material than the element body.

16. A passive component comprising:
a body portion having a first main surface; and
at least one passive element at least a part of which is inside the body portion, wherein the first main surface at least partially includes a flat surface including an inorganic substance and having a surface roughness of equal to or less than $1/1000$ of a thickness of the body portion in a direction orthogonal to the first main surface or equal to or less than 10 nm, the body portion includes an inorganic layer having a first main surface and a second main surface facing each other, and a magnetic portion on the second main surface of the inorganic layer, the first main surface of the inorganic layer configures at least a part of the first main surface of the body portion, the passive element includes a coil, and the coil is covered with the magnetic portion.

17. The passive component according to claim 16, wherein the coil is wound along a plane parallel to the first main surface, the body portion further includes an organic insulating portion at least on a side surface of the coil orthogonal to the first main surface of the body portion, the magnetic portion covers the coil and the organic insulating portion, and the coil is in contact with the organic insulating portion and the magnetic portion.

18. The passive component according to claim 17, wherein a thickness of the organic insulating portion in a direction orthogonal to the first main surface of the body portion is thicker than a thickness of the coil in a direction orthogonal to the first main surface of the body portion.

19. A passive component comprising:
a body portion having a first main surface; and
at least one passive element at least a part of which is inside the body portion, wherein the first main surface at least partially includes a flat surface including an inorganic substance and having a surface roughness of equal to or less than $1/1000$ of a thickness of the body portion in a direction orthogonal to the first main surface or equal to or less than 10 nm, the body portion further includes a second main surface facing the first main surface;

the second main surface at least partially includes a flat surface including an inorganic substance, the body portion includes an inorganic layer having a first main surface and a second main surface facing each other, and a through-wiring penetrating the inorganic layer from the first main surface to the second main surface of the inorganic layer, the first main surface of the inorganic layer configures at least a part of the first main surface of the body portion, the at least one passive element includes at least an inductor element and a capacitor element, the inductor element includes a coil, the capacitor element includes two capacitor electrodes facing each other and a dielectric layer between the two capacitor electrodes, and a conductive material of the two capacitor electrodes is different from a conductive material of each of the through-wiring and the coil, the body portion includes an insulating layer covering at least the coil, and a material of the dielectric layer is the same as a material of the insulating layer.

20. A passive component comprising:

a body portion having a first main surface; and at least one passive element at least a part of which is inside the body portion, wherein the first main surface at least partially includes a flat surface including an inorganic substance and having a surface roughness of equal to or less than $1/1000$ of a thickness of the body portion in a direction orthogonal to the first main surface or equal to or less than 10 nm, the body portion further includes a second main surface facing the first main surface;

the second main surface at least partially includes a flat surface including an inorganic substance, the body portion includes an inorganic layer having a first main surface and a second main surface facing each other, and a through-wiring penetrating the inorganic layer from the first main surface to the second main surface of the inorganic layer, the first main surface of the inorganic layer configures at least a part of the first main surface of the body portion, the at least one passive element includes at least a capacitor element, the capacitor element includes two capacitor electrodes facing each other and a dielectric layer between the two capacitor electrodes, and a conductive material of the two capacitor electrodes is different from a conductive material of the through-wiring.

* * * * *